(12) United States Patent
Kiyota

(10) Patent No.: US 7,812,453 B2
(45) Date of Patent: Oct. 12, 2010

(54) SEMICONDUCTOR DEVICE

(75) Inventor: Akio Kiyota, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/201,369

(22) Filed: Aug. 29, 2008

(65) Prior Publication Data

US 2009/0108375 A1 Apr. 30, 2009

(30) Foreign Application Priority Data

Oct. 24, 2007 (JP) ............................. 2007-276325
Jan. 7, 2008 (JP) ............................. 2008-000339

(51) Int. Cl.
*H01L 23/48* (2006.01)

(52) U.S. Cl. ....................... 257/758; 257/759; 257/760; 257/401; 257/202; 257/288

(58) Field of Classification Search ................ 257/758, 257/759, 760, 401, 202, 288
See application file for complete search history.

(56) References Cited

U.S. PATENT DOCUMENTS

| | | | |
|---|---|---|---|
| 6,784,548 | B2 | 8/2004 | Kouno et al. |
| 2002/0190382 | A1 | 12/2002 | Kouno et al. |
| 2003/0071263 | A1 | 4/2003 | Kouno et al. |
| 2007/0224761 | A1 | 9/2007 | Takami |

FOREIGN PATENT DOCUMENTS

| | | |
|---|---|---|
| JP | 09-306996 | 11/1997 |
| JP | 2002-373896 | 12/2002 |

OTHER PUBLICATIONS

Tuinhout, H.P. et al., "Test Structures for Investigation of Metal Coverage Effects on MOSFET Matching," Proc. IEEE 1997 Int. Conference on Microelectronic Test Structures, vol. 11, pp. 179-183, Mar. 1997.
Lakshminarayanan, S. et al., "Electrical Characterization of the Coppoer CMP Process and Deviation of Metal Layout Rules," IEEE Transaction on Semiconductor Manufacturing, vol. 16, No. 4, Nov. 2003.
Lin, Chenting et al., "Planarization of dual-damascene post-metal-CMP structures," Interconnect Technology, 1999. IEEE International Conference, May 24-26, 1999, pp. 86-88.

*Primary Examiner*—Long Pham
(74) *Attorney, Agent, or Firm*—McDermott Will & Emery LLP

(57) ABSTRACT

The present invention proposes a dummy metal fill structure which makes it possible to reduce variations in transistor characteristics as much as possible even if mask misalignment occurs, as well as to ensure the intended planarizing effect of the metal CMP process. The dummy metal fill formed above the gate electrode extends in the gate length direction with both ends thereof protruding from a region corresponding to the gate electrode. Even if a mask for forming a wiring layer is misaligned and the position of the dummy metal fill is misaligned from an intended position, the shape of the dummy metal fill within a region of the gate electrode is kept symmetric with respect to the center of the gate electrode.

5 Claims, 46 Drawing Sheets

SEMICONDUCTOR DEVICE

CROSS-REFERENCE TO RELATED APPLICATION

This non-provisional application claims priority under 35 U.S.C. §119(a) of Japanese Patent Applications No. 2007-276325 filed in Japan on Oct. 14, 2007 and No. 2008-000339 filed in Japan on Jan. 7, 2008, the entire contents of which are hereby incorporated by reference.

BACKGROUND OF THE INVENTION

1. Field of the Invention

The present invention relates to semiconductor devices. In particular, it relates to a technology for forming a dummy fill used for metal CMP (chemical mechanical polishing).

2. Description of Related Art

As the design rules for semiconductor devices become finer, a metal CMP process is commonly used to planarize an interlayer insulating film in a multilayer wiring structure.

In a conventional case where the metal CMP process is applied to a semiconductor device pattern in which a large density difference lies between high density parts and low density parts, excessive polish is likely to occur in the low density parts of the pattern. In order to prevent this phenomenon and peeling of the pattern and to achieve improved planarization of the interlayer insulating film, insertion of dummy fills in the low density parts, in addition to the essentially required active traces, has been proposed (cf. Patent literature 1). A process of forming the dummy fills is varied depending on design rules for layout of a wiring pattern and the amount of data for forming a mask pattern.

(Patent Literature 1) Publication of Japanese Patent Application No. 9-306996

(Patent Literature 2) Publication of Japanese Patent Application No. 2002-373896 (FIGS. 1 and 2)

(Nonpatent Literature 1) H. P. Tuinhout, et al., "Test Structures for Investigation of Metal Coverage Effects on MOSFET Matching", Proc. IEEE 1997 Int. Conference on Microelectronic Test Structures, Vol. 11, pp. 179-183, March 1997

(Nonpatent Literature 2) S. Lakshminarayanan et al., "Electrical Characterization of the Copper CMP Process and Deviation of Metal Layout Rules", IEEE TRANSACTION ON SEMICONDUCTOR MANUFACTURING, VOL. 16, NO. 4, NOVEMBER 2003

(Nonpatent Literature 3) Chenting Lin, Larry Clevenger, Florian Schnabel, Fen Fen Jamin, David Dobuzinski, "Planarization of dual-damascene post-metal-CMP structures", Interconnect Technology, 1999. IEEE International Conference, 24-26 May 1999 Page(s): 86-88

In the case of forming MOSFETs (Metal Oxide Semiconductor Field Effect Transistors) having a relatively long gate length, e.g., around 10 µm, on a semiconductor substrate, parts of a pattern corresponding to MOSFET regions become less dense than the other parts. If the metal CMP process is applied to this case, excessive erosion is more likely to occur in the MOSFET regions and intended planarity may not possibly be obtained. From this aspect, there arises a need of providing dummy metal fills above gate electrodes of the MOSFETs having a relatively long gate length.

However, the provision of metals above the MOS transistors brings about variations of transistor characteristics, such as degradation of a drain current, as reported by Nonpatent Literature 1. That is, when the dummy fills are formed above the gate electrodes, there arises a difficulty in making the characteristics of the MOS transistors uniform.

In order to make the transistor characteristics uniform and achieve the intended effect of the metal CMP process on the MOSFETs having a relatively long gate length, Patent Literature 2 proposes to arrange the dummy fill so that its geometrical center is aligned with a center of a channel in the gate length direction. If the MOSFET is obtained in exactly the same shape as the mask dimension, it will be depicted as shown in a plan view of FIG. 45 and in a sectional view of FIG. 46 taken along the I-II line shown in FIG. 45.

In an actual manufacturing process, however, a mask for forming the metal wiring layer is misaligned. As a result of the misalignment, the structure shown in FIGS. 45 and 46 varies as shown in FIGS. 47 and 48. Specifically, the dummy fill is no longer symmetric with respect to the geometrical center GC of the gate electrode due to the mask misalignment in the gate length direction. As a result, the transistor characteristics vary depending on the direction of a current flowing between a source and a drain. The variations of transistor characteristics are not preferable particularly for a current mirror circuit and a differential input of an analog circuit in which matched transistor characteristics are essential.

If a material softer than an interlayer insulating film or a barrier metal is used as the dummy metal fill, and when the width of the dummy metal fill is increased, dishing (excessive polish) occurs. In this case, adjacent active traces are also affected. In the above-described structure, the width of the dummy metal fill is increased as the channel region is enlarged. Therefore, as shown in FIG. 49, adjacent source and drain electrodes are also polished too much due to the presence of the dummy metal fill. As a result, parasitic resistance of the source and the drain increases, thereby deteriorating the performance of the semiconductor device.

SUMMARY OF THE INVENTION

An object of the present invention is to propose a dummy metal fill structure which makes it possible to reduce variations in transistor characteristics as much as possible even if mask misalignment occurs, as well as to ensure the intended planarizing effect of the metal CMP process.

Another object of the present invention is to propose a dummy metal fill structure which makes it possible to make the MOS transistor characteristics as uniform as possible and restrain the increase in parasitic resistance of the source and the drain even if a channel region is enlarged, as well as to ensure the intended planarizing effect of the metal CMP process.

The present invention is directed to a semiconductor device including: a semiconductor substrate; a MOS transistor formed on the semiconductor substrate including a first main electrode region as a source, a second main electrode region as a drain and a gate electrode for controlling a current flowing between the source and the drain; and a dummy metal fill inserted in a wiring layer formed above the MOS transistor so that the dummy metal fill is located above the gate electrode, wherein the dummy metal fill extends in a gate length direction with both ends thereof protruding from the gate electrode.

With this configuration, the dummy metal fill formed above the gate electrode extends in the gate length direction with both ends thereof protruding from the gate electrode. Therefore, even if a mask is misaligned and the position of the dummy metal fill is misaligned from an intended position, the shape of the dummy metal fill within a region of the gate electrode region is kept symmetric with respect to a center of the gate electrode. Thus, the degrees of characteristic degradation of the MOS transistors due to the dummy metal fill are made uniform even if the mask misalignment occurs.

According to the present invention, a semiconductor device includes: a semiconductor substrate; a MOS transistor formed on the semiconductor substrate including a first main electrode region as a source, a second main electrode region as a drain and a gate electrode for controlling a current flowing between the source and the drain; and a dummy metal fill which is stacked above a channel region of the MOS transistor and includes a plurality of dummy metal segments. The dummy metal segments of the dummy metal fill are spread in the channel region in point symmetry with respect to a geometrical center of the channel region. In this context, a region for forming a channel (having a channel width W and a channel length L) in the gate electrode of the semiconductor device is defined as the channel region. A geometrical center of the channel region is defined as a channel geometrical center CC.

With this configuration, the intended planarization by the metal CMP process is achieved. At the same time, the width of each dummy metal segment is not increased even if the channel region is enlarged. Therefore, the characteristics of the MOS transistors are made uniform without increasing a parasitic resistance of the source and the drain.

According to the present invention, as described above, the shape of the dummy metal fill within the region of the gate electrode is kept symmetric even if the mask misalignment occurs. Therefore, intended planarization by the metal CMP process is achieved and the characteristics of the MOS transistors are made uniform.

Further, according to the present invention, the width of each dummy metal segment is not increased even if the channel region is enlarged. Therefore, the intended planarizing effect of the metal CMP process is ensured and the characteristics of the MOS transistors are made uniform, without increasing the parasitic resistance of the source and the drain.

DETAILED DESCRIPTION OF THE INVENTION

Hereinafter, most preferred embodiments of the present invention are explained with reference to the drawings.

Embodiment 1

Figure 1:
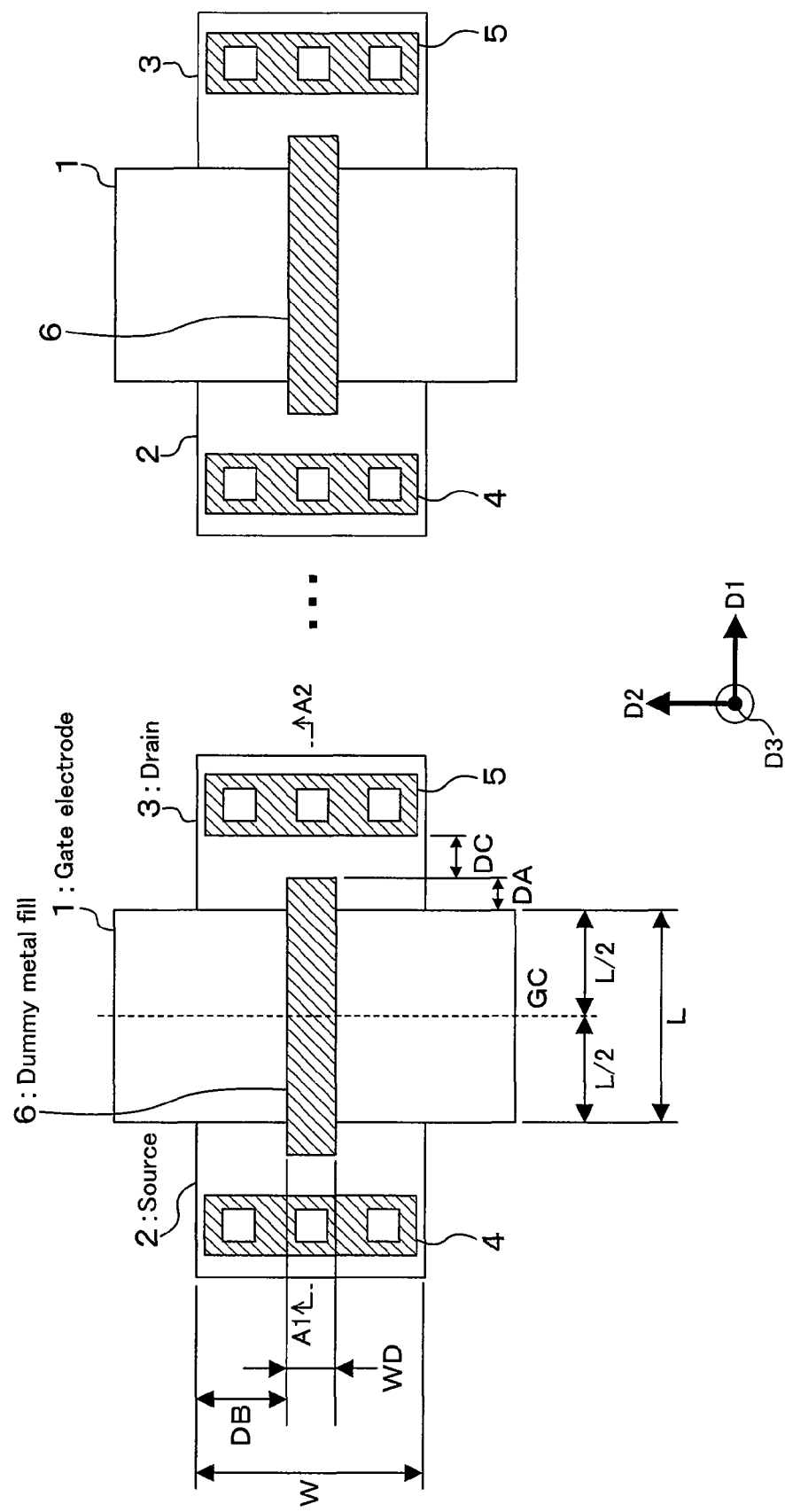
FIG. 1 is a plan view schematically illustrating a semiconductor device according to Embodiment 1 of the present invention.
Figure 2:
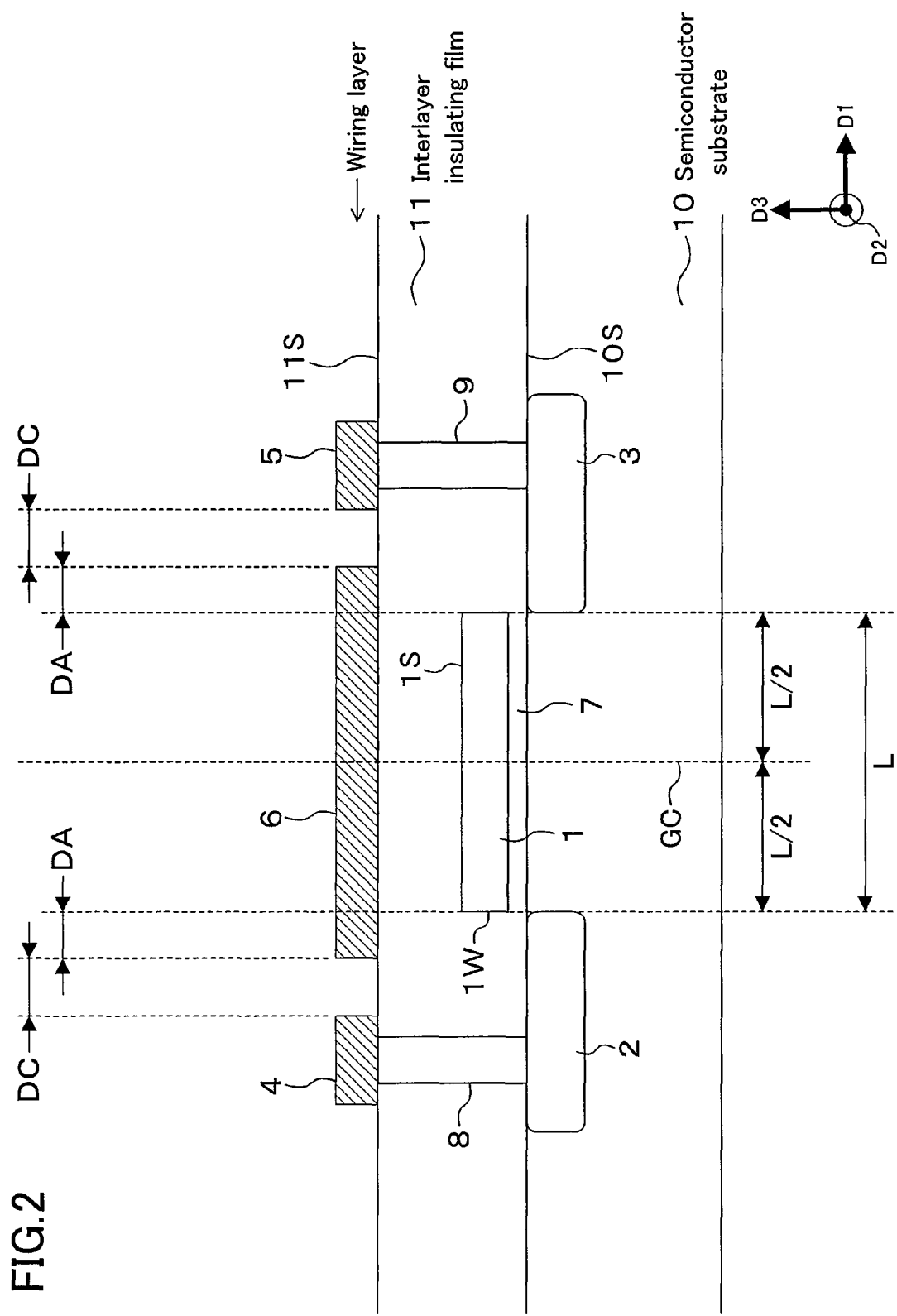
FIG. 2 is a sectional view common to semiconductor devices of FIG. 1 and FIG. 5.

FIG. 1 is a plan view illustrating a plurality of MOS transistors (MOSFETs) formed in a semiconductor device according to Embodiment 1 of the present invention. FIG. 2 is a longitudinal section taken along the line A1-A2 shown in FIG. 1, illustrating the structure of any one of the plurality of MOS transistors.

As shown in FIGS. 1 and 2, each of the MOS transistors formed on a semiconductor substrate 10 includes a first main electrode region 2 and a second main electrode region 3 as a source and a drain (hereinafter may be referred simply to the source 2 and the drain 3), and a gate electrode 1 for controlling a current flowing between the source and the drain. The first and second main electrode regions 2 and 3 are formed within the semiconductor substrate 10. The gate electrode 1 is formed on a top surface of a gate insulating film 7 formed on part of a principle surface 10S of the semiconductor substrate 10 located between the first and second main electrode regions 2 and 3.

Hereinafter, it is defined that a gate length direction, i.e., a direction in which the current flows between the source and the drain, is a first direction D1, a gate width direction is a second direction D2 and a direction perpendicular to the principle surface of the semiconductor substrate 10 is a third direction D3. The first, second and third directions D1, D2 and D3 are perpendicular to each other. The first and second main electrode regions 2 and 3 are arranged to be opposed to each other in the first direction D1. The gate electrode 1 and the first and second main electrode regions 2 and 3 extend in the second direction D2. The gate length L of the gate electrode 1 (a length of a transistor channel) is relatively long, e.g., around 3 μm to 10 μm.

An interlayer insulating film 11 is formed on the principle surface 10S of the semiconductor substrate 10 and a top surface 1S and side surfaces 1W of the gate electrode 1 to cover the MOS transistor. A source contact hole 8 and a drain contact hole 9 are formed in the interlayer insulating film 11. The contact holes 8 and 9 are filled with metal plugs, respectively.

A wiring layer is formed on a top surface 11S of the interlayer insulating film 11. A dummy metal fill 6 is inserted in this wiring layer to be located above the gate electrode 1. If the wiring layer is made of aluminum, the dummy metal fill 6 is also made of an aluminum film.

The dummy metal fill 6 extends in the first direction D1 and has a width WD in the second direction D2 (smaller than a width of a transistor channel). The dummy metal fill 6 is configured to protrude from a region corresponding to the gate electrode 1 at both ends thereof in the first direction D1. That is, a length of the dummy metal fill 6 in the first direction D1 is greater than the gate length L by a length DA of each of the protruding ends of the dummy metal fill 6. The protrusion length DA is preferably adjusted to be equal to or greater than the maximum amount of mask misalignment in the first direction D1. The protrusion length DA is, for example, 0.1 μm to 0.2 μm, though it varies depending on the performance of an exposure apparatus. Alternatively, when the gate length L is about 2 μm, the protrusion length DA is 5 to 10% of the gate length. When the gate length L is about 10 μm, the protrusion length DA is 1 to 2%. Further, a distance DB lies between the dummy metal fill 6 and the edges of the source and the drain in the second direction D2. The distance DB is preferably adjusted to be equal to or greater than the maximum amount of mask misalignment in the second direction D2. Further, in the first direction D1, a geometrical center of the dummy metal fill 6 coincides with a geometrical center GC of the gate electrode 1.

A source electrode 4 made of an aluminum film is formed on part of the top surface 11S of the interlayer insulating film 11 immediately above the source 2. Further, a drain electrode 5 made of an aluminum film is formed on part of the top surface 11S immediately above the drain 3. A dimension of the dummy metal fill 6 in the third direction D3, i.e., a thickness thereof, is equal to the thicknesses of the source electrode 4 and the drain electrode 5. Specifically, the dimensions of the dummy metal fill 6 are defined so that the density of part of a wiring pattern above the gate electrode 1 sandwiched between the source electrode 4 and the drain electrode 5 becomes equal to or higher than a predetermined value.

A feature of the present embodiment lies in the layout of the dummy metal fill 6 relative to the gate electrode 1. According to the present embodiment, the dummy metal fill 6 extending in the first direction D1 has the protrusion length DA in the first direction D1 and the distance DB from the edges of the source and the drain in the second direction D2.

Figure 3:
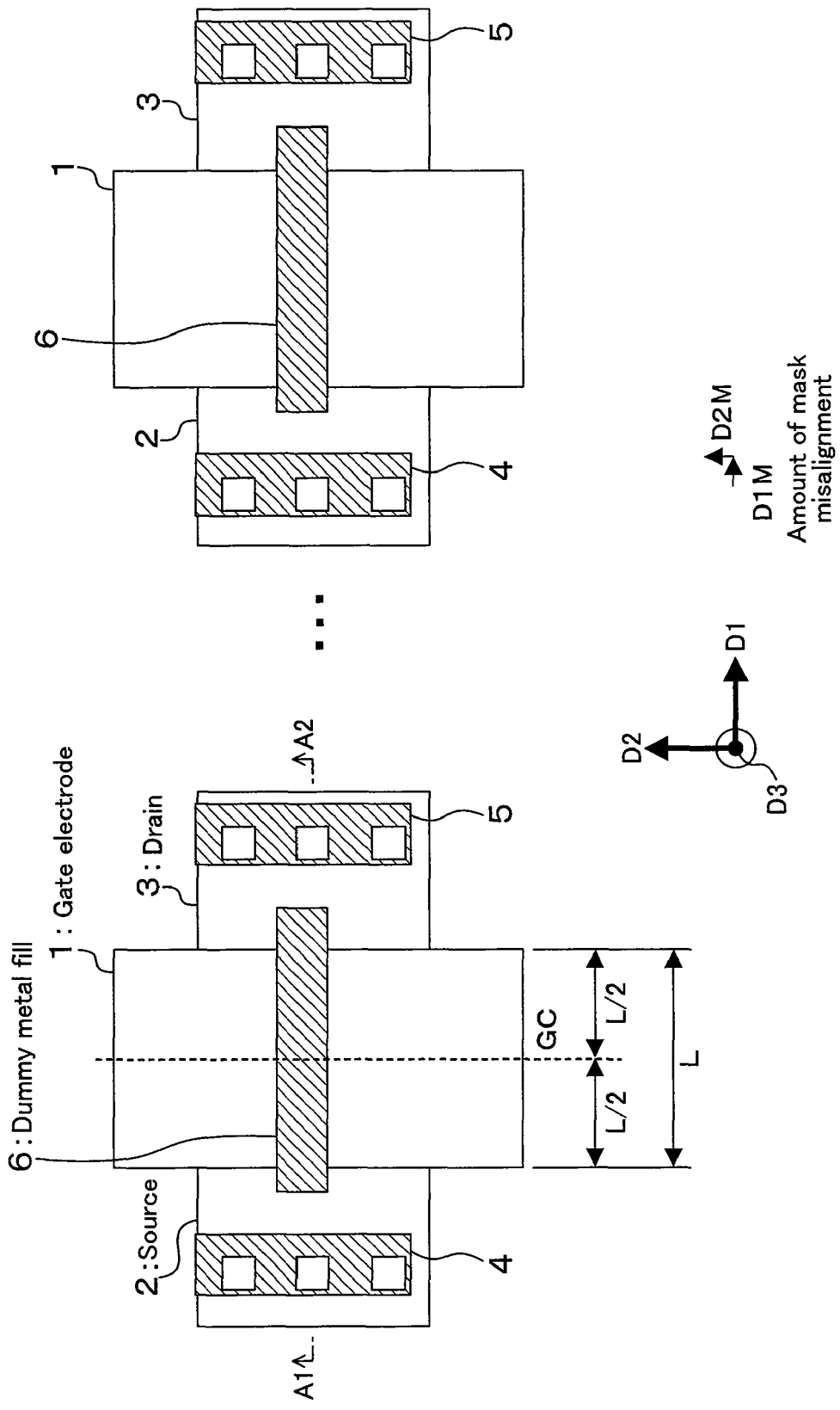
FIG. 3 is a plan view illustrating an example of the semiconductor device of FIG. 1 obtained as a result of mask misalignment.
Figure 4:
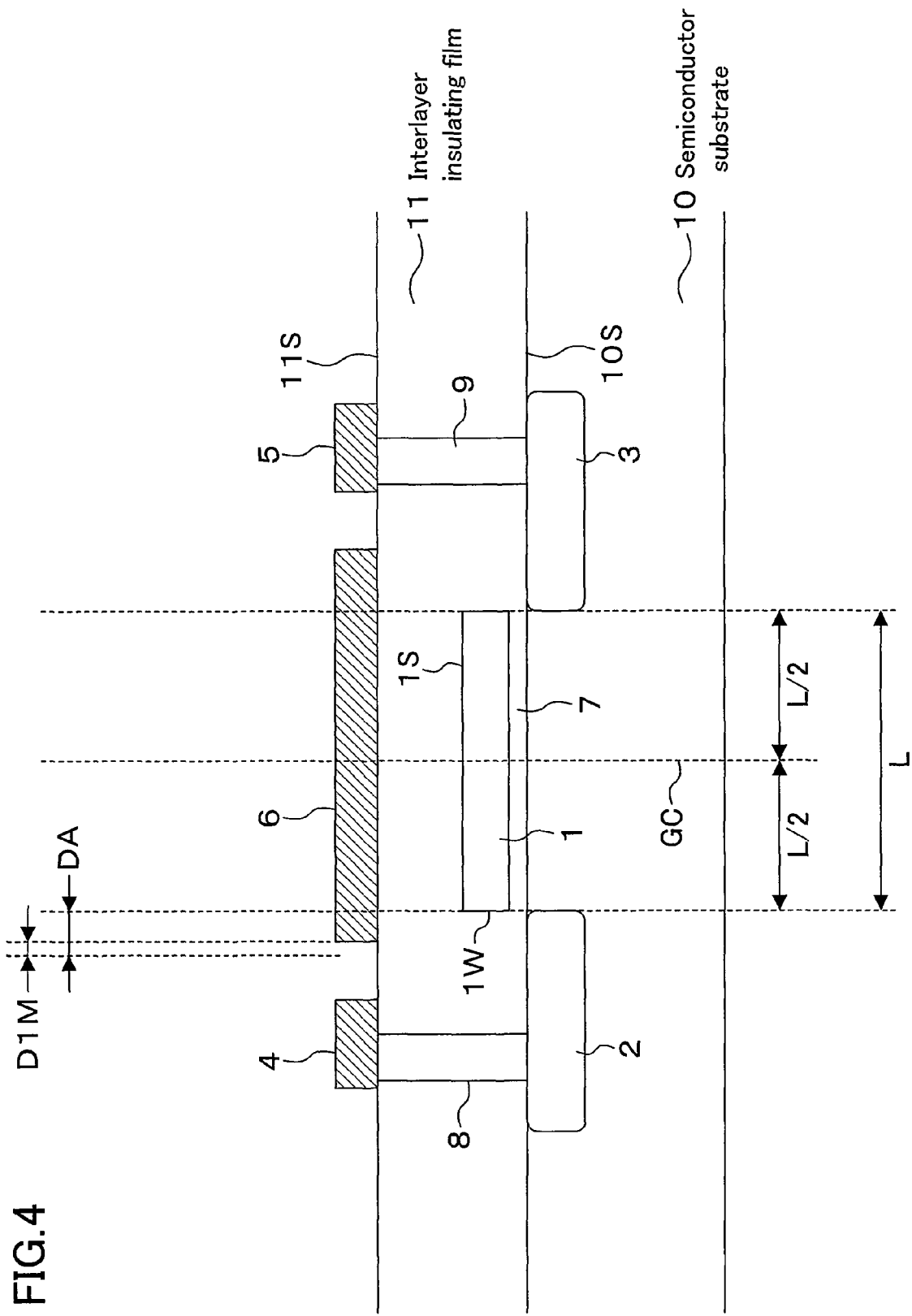
FIG. 4 is a sectional view of the semiconductor device of FIG. 3.

FIGS. 3 and 4 are a plan view and a sectional view each illustrating the structure of the MOS transistors in the semiconductor device of the present embodiment obtained as a result of mask misalignment. In the MOS transistor shown in FIGS. 3 and 4, a mask for forming the metal wiring pattern is misaligned by a distance D1M in the first direction D1 and by a distance D2M in the second direction D2 as compared with the structure shown in FIGS. 1 and 2.

The dummy metal fill 6 is configured to have the protrusion length DA in the gate length direction, i.e., the first direction D1. Therefore, as shown in FIGS. 3 and 4, even if the mask is misaligned by the distance D1M in the first direction D1, the ends of the dummy metal fill 6 still protrude from a region corresponding to the gate electrode 1. The shape of the dummy metal fill 6 within the gate length L, i.e., in a region of the gate electrode 1, is kept symmetric with respect to the geometric center GC of the gate electrode 1. Therefore, the degrees of characteristic degradation of the MOS transistors due to the insertion of the dummy metal fill 6 are made uniform even if the mask is misaligned.

Further, in the second direction D2, the dummy metal fill 6 is spaced from the edges of the source and the drain by the distance DB. Therefore, even if the mask is misaligned by the distance D2M in the second direction D2, the dummy metal fill 6 does not protrude out of the channel region. Thus, the area of the dummy metal fill in the channel region is kept unchanged.

According to the present embodiment, as described above, the dummy metal fill extending in the gate length direction has the protrusion length in the gate length direction. Therefore, even if the mask is misaligned in the gate length direction, the ends of the dummy metal fill still protrude from the gate electrode. Therefore, even if the mask misalignment occurs, the shape of the dummy metal fill within the region of the gate electrode is kept symmetric. Thus, the device characteristics are made uniform, while intended planarization by the metal CMP process is achieved.

Embodiment 2

Figure 5:
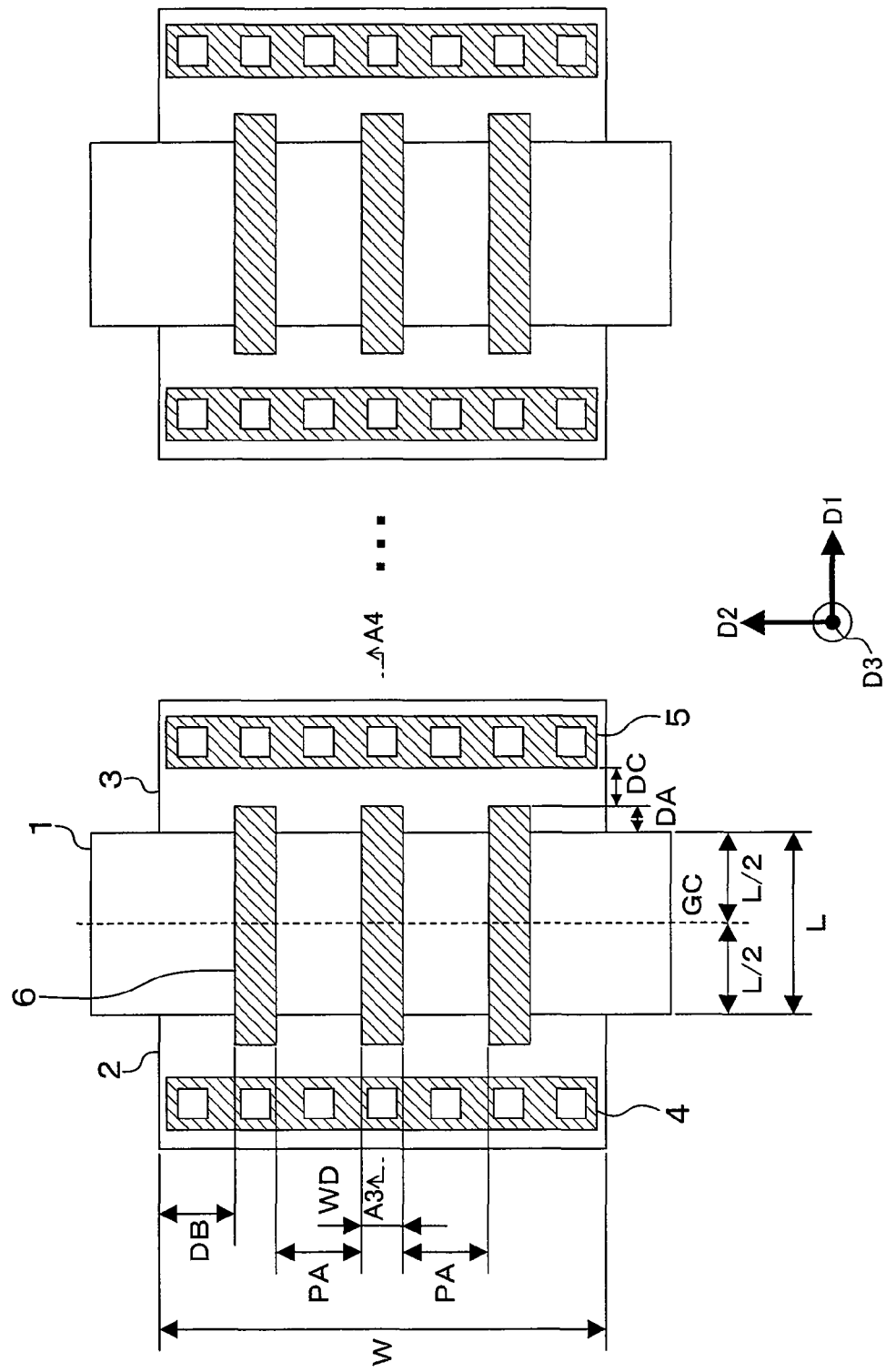
FIG. 5 is a plan view schematically illustrating a semiconductor device according to Embodiment 2 of the present invention.

Embodiment 2 of the present invention is directed to a modified version of the semiconductor device of Embodiment 1 described above. FIG. 5 is a plan view illustrating a plurality of MOS transistors in a semiconductor device according to the present embodiment. In FIG. 5, the same components as those shown in FIG. 1 are indicated by the same reference numerals. A longitudinal section taken along the line A3-A4 indicated in FIG. 5 is the same as the longitudinal section of FIG. 2.

According to the present embodiment, as shown in FIG. 5, a plurality of dummy metal fills 6, each of which has the protrusion length DA as explained in Embodiment 1, are arranged in the second direction D2, i.e., the gate width direction, in a stripe pattern above the gate electrode 1. For example, when the channel width of the MOS transistor is greater than the maximum wiring width allowable under the design rule, the plurality of dummy metal fills 6 are arranged in a stripe pattern as shown in FIG. 5. The number of the dummy metal fills 6 is determined so that the density of part of the wiring pattern immediately above the gate electrode 1 sandwiched between the source electrode 4 and the drain electrode 5 is equal to or greater than a predetermined value.

Figure 6:
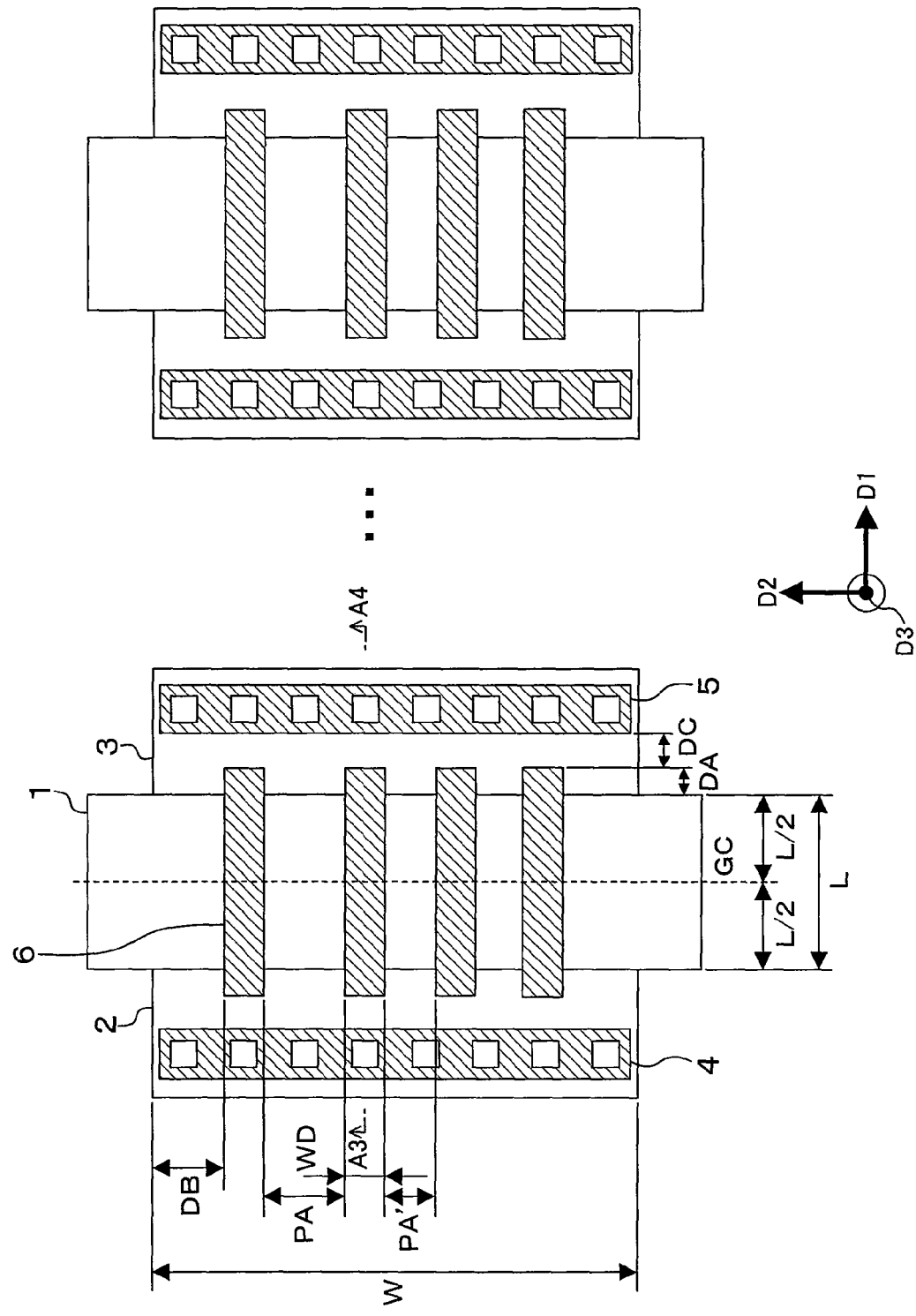
FIG. 6 is a plan view schematically illustrating a variant of the semiconductor device according to Embodiment 2 of the present invention.

In FIG. 5, intervals PA between the dummy metal fills 6 are depicted to be equal. However, the intervals may not necessarily be equal as shown in FIG. 6.

According to the present embodiment described above, the dummy metal fills explained in Embodiment 1 are arranged in a stripe pattern. As a result, intended planarization by the metal CMP process is performed even on the MOS transistor having a large channel width. Further, even if the mask misalignment occurs, the shape of each of the dummy metal fills within the region of the gate electrode is kept symmetric. Thus, device characteristics are made uniform.

Embodiment 3

Figure 7:
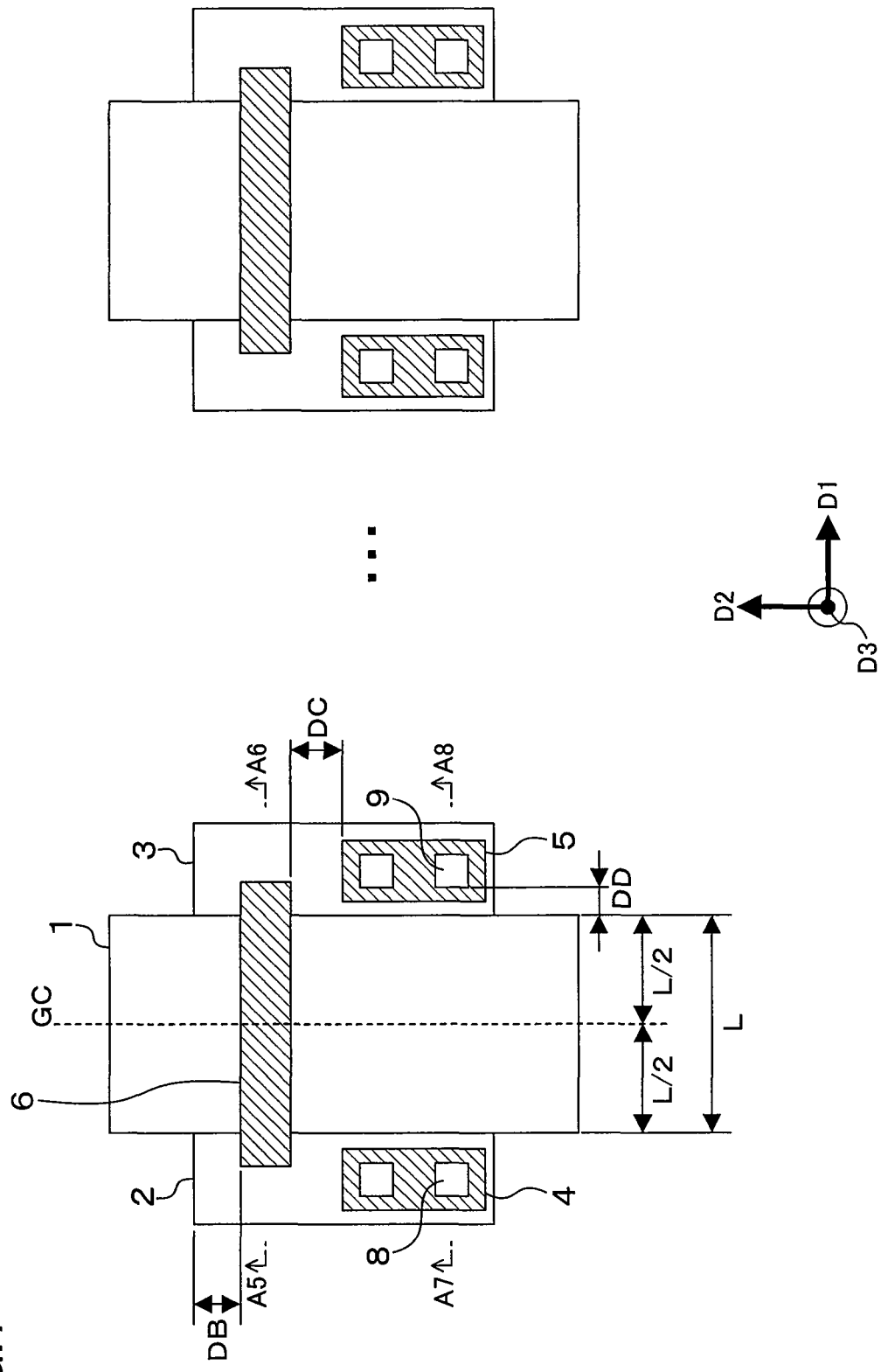
FIG. 7 is a plan view schematically illustrating a semiconductor device according to Embodiment 3 of the present invention.
Figure 8:
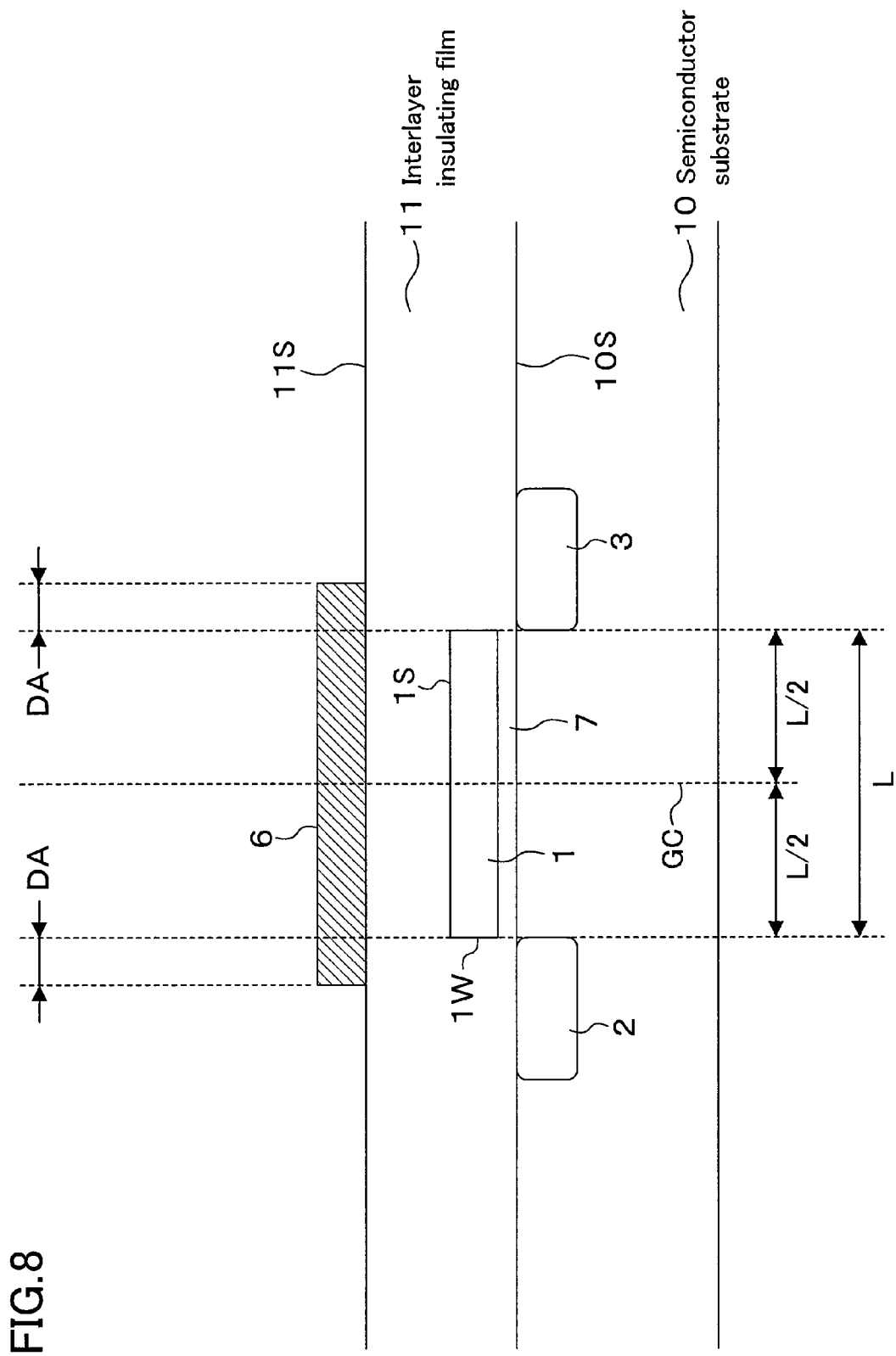
FIG. 8 is a sectional view of the semiconductor device of FIG. 7.
Figure 9:
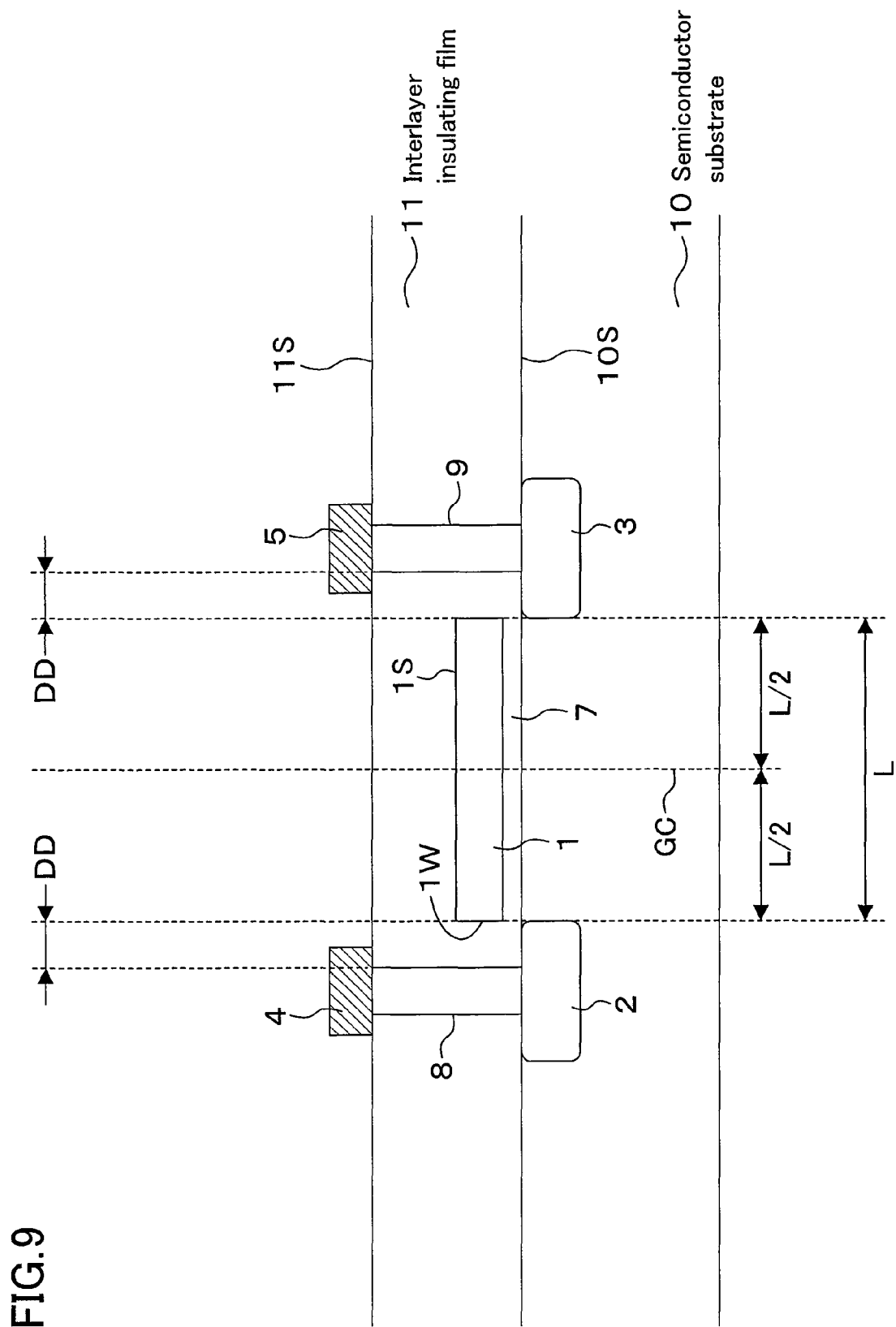
FIG. 9 is a sectional view of the semiconductor device of FIG. 7.

Embodiment 3 of the present invention is directed to a modified version of the semiconductor device of Embodiment 1 described above. FIG. 7 is a plan view illustrating MOS transistors in a semiconductor device according to the present embodiment. In FIG. 7, the same components as those shown in FIG. 1 are indicated by the same reference numerals. FIG. 8 is a longitudinal section taken along the line A5-A6 shown in FIG. 7. FIG. 9 is a longitudinal section taken along the line A7-A8 shown in FIG. 7.

According to the present embodiment shown in FIGS. 7 to 9, for the purpose of further size reduction of the MOS transistor of Embodiment 1, the dummy metal fill 6 is configured to overlap with the source electrode 4 as a first metal electrode and the drain electrode 5 as a second metal electrode in the first direction D1, i.e., in the gate length direction. More specifically, the source contact 8 and the drain contact 9 are arranged to have a minimum distance DD allowable under the design rule from the gate electrode 1. Further, the dummy metal fill 6 is arranged to have a minimum distance DC allowable under the design rule from each of the source electrode 4 and the drain electrode 5.

When the thus-configured MOS transistors are arranged in an array pattern, the number of transistors in a unit area is increased. Accordingly, the present embodiment offers the same effect as that of Embodiment 1 and at the same time, achieves the reduction of transistor area.

Figure 10:
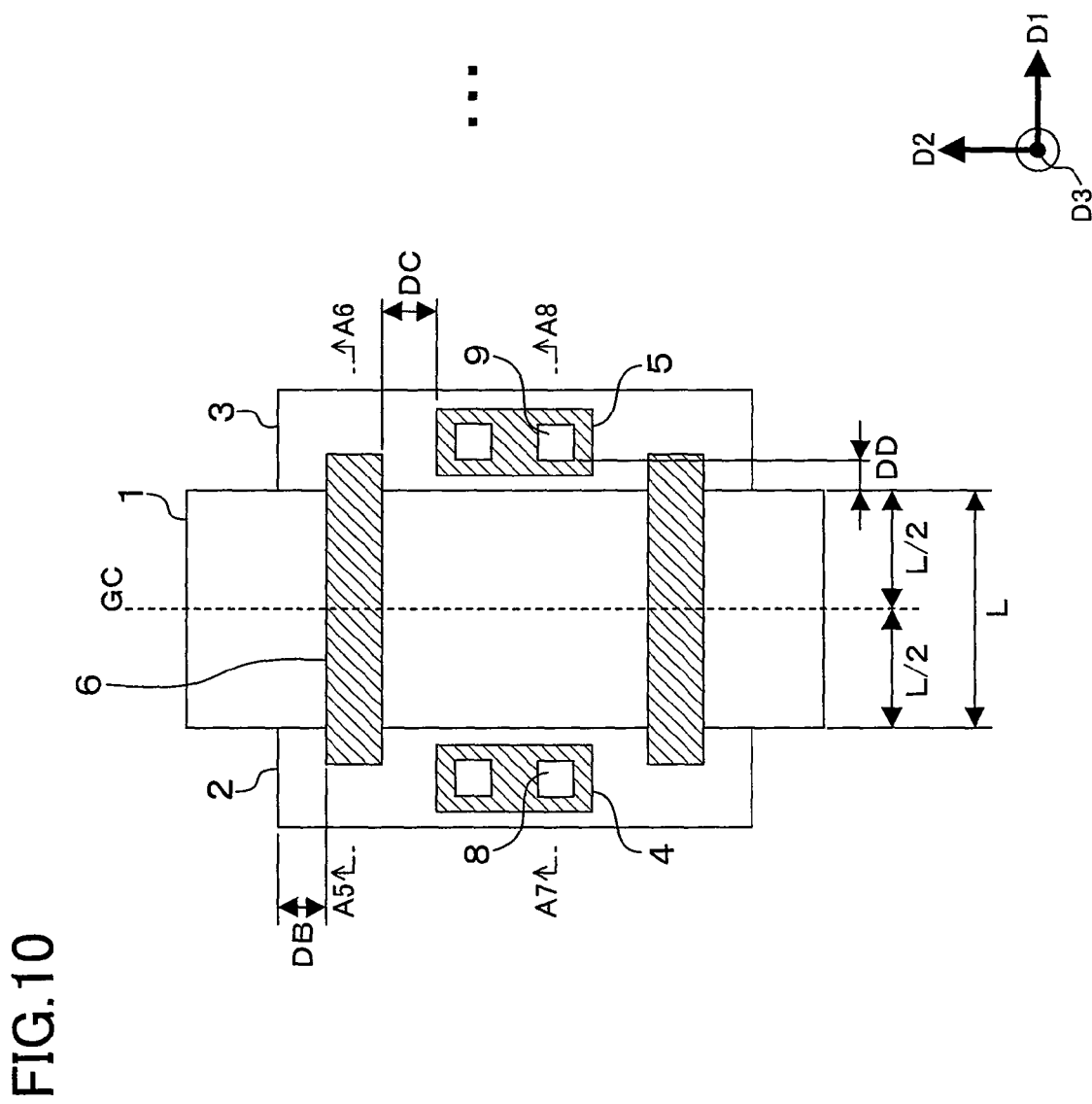
FIG. 10 is a plan view schematically illustrating a variant of the semiconductor device according to Embodiment 3 of the present invention.

Referring to FIG. 7, the dummy metal fill 6 is positioned on one side of the source electrode 4 and the drain electrode 5 in the gate width direction. However, the dummy metal fill 6 may be provided on each side of the source electrode 4 and the drain electrode 5 as shown in FIG. 10. Referring to FIGS. 7 and 10, the dummy metal fill 6 overlaps with both of the source electrode 4 and the drain electrode 5 in the gate length direction. However, the reduction of transistor area is also achieved when the dummy metal fill 6 overlaps with any one of the source electrode 4 and the drain electrode 5.

Examples of Wiring Layer of Different Structure and Material

According to the above-described embodiments, the wiring layer formed above the MOS transistors is provided on the top surface of the interlayer insulating film. Conductive traces and the dummy metal fills in the wiring layer are made of aluminum, for example. However, the structure and the material do not limit the present invention. For example, when the conductive traces and the dummy metal fills made of copper are buried in a groove formed in the top surface of the interlayer insulating film, the same effect as those described in the above-described embodiments is obtained. In this case, the obtained semiconductor device is the same as those of the above-described embodiments when viewed in plan, while it is not the same when viewed in section.

As compared with aluminum (Al) widely used as a wiring material, copper (Cu) is lower in specific resistance and higher in current density. For these reasons, copper has been used in highly integrated device components and semiconductor products which require high current density. When use of copper and a conventional patterning process are combined, erosion of copper occurs. To avoid this phenomenon, a damascene process is applied. Specifically, copper as the wiring material is buried in a groove formed in advance in an insulating layer, and then unnecessary part of the copper is removed by chemical mechanical polishing (a metal CMP process). Further, for electrical connection between a lower wiring layer and an upper wiring layer, a contact is formed by burying copper material. According to a so-called dual-damascene process, the contact and the upper wiring layer are formed at the same time after the lower wiring layer is formed by the damascene process.

In both of the damascene process and the dual-damascene process, similar to the case of forming the aluminum wiring layer, the insertion of dummy fills is required. At the same time, the influence of the dummy fills on the device is also a matter of concern.

Figure 11:
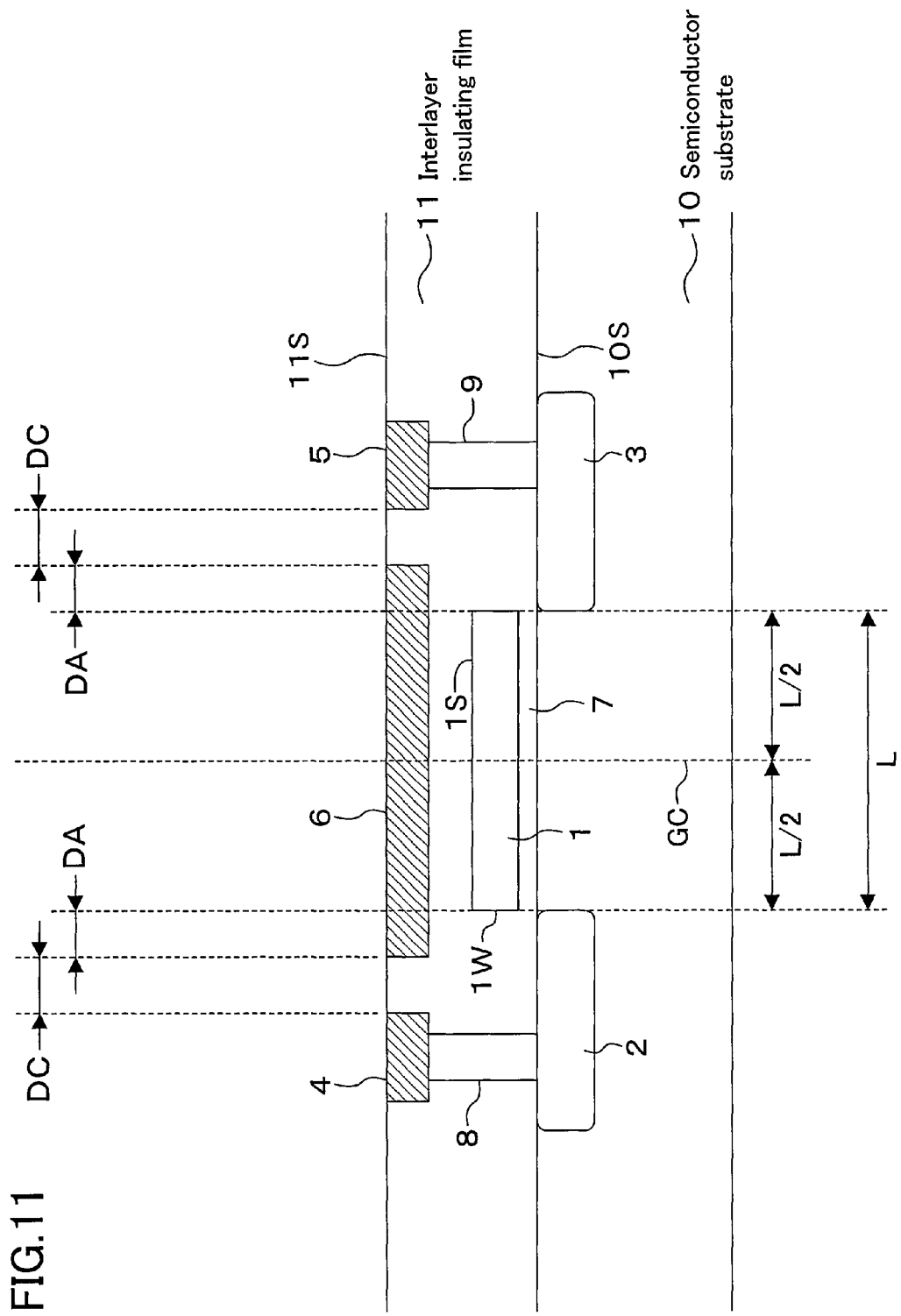
FIG. 11 is a sectional view of an example of the semiconductor device of Embodiment 1 in which copper is used as a wiring material.
Figure 12:
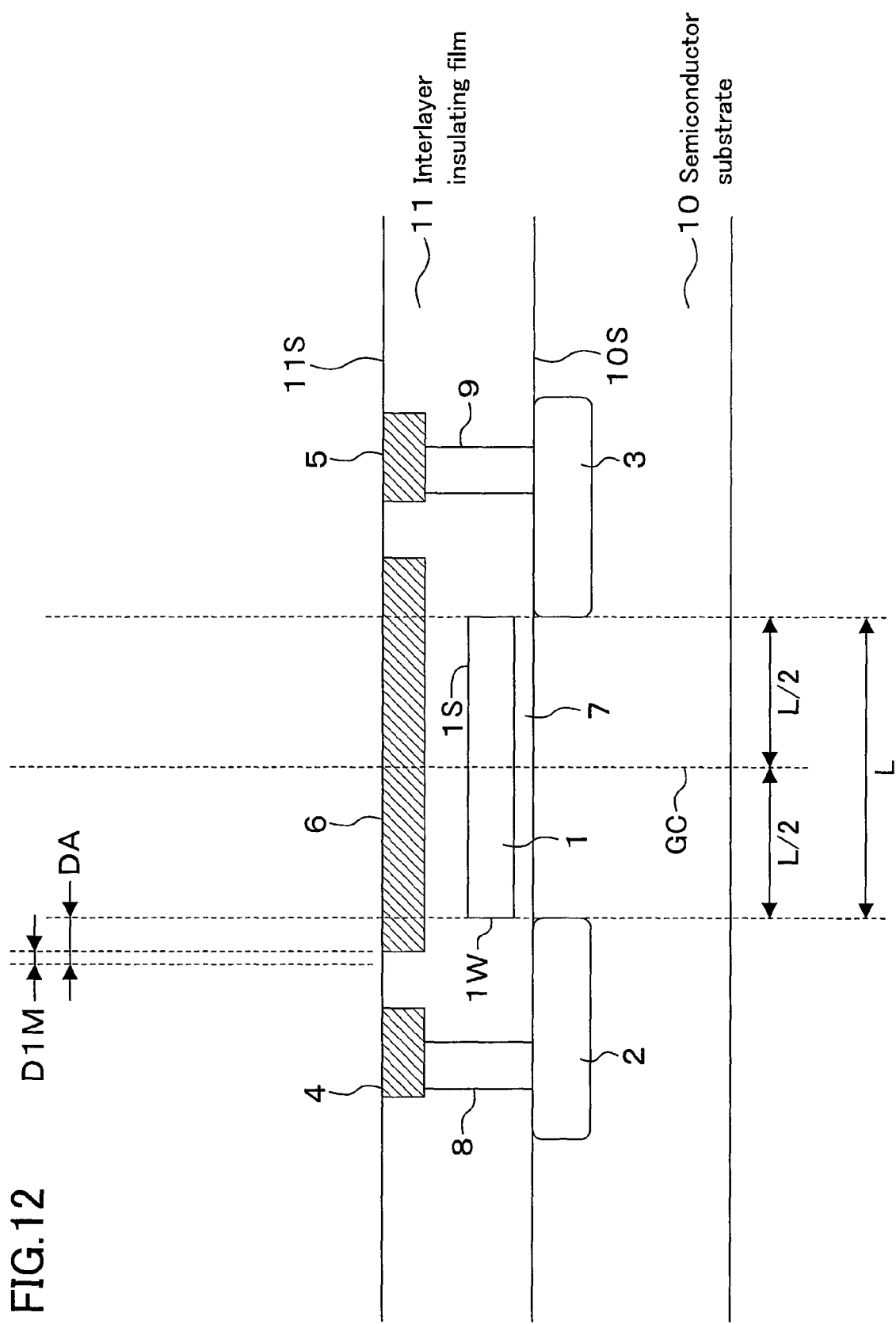
FIG. 12 is a sectional view illustrating an example of the semiconductor device of FIG. 1 obtained as a result of mask misalignment.

FIG. 11 is a longitudinal section taken along the line A1-A2 of FIG. 1 illustrating an example of Embodiment 1 in which the wiring material is replaced with copper. The dummy metal fill 6, the source electrode 4 and the drain electrode 5 are made of copper and buried in a groove formed in the top surface 11S of the interlayer insulating film 11. Even if mask misalignment occurs in a manufacturing process under finer design rules using the damascene process or the dual-damascene process, both ends of the dummy metal fill 6 protrude from a region corresponding to the gate electrode 1, as explained in Embodiment 1. The shape of the dummy metal fill 6 within the range of the gate length L is kept symmetric. FIG. 12 is a sectional view of an example of the MOS transistor obtained as a result of mask misalignment. Thus, the shape of the dummy metal fill 6 is kept symmetric even if the mask misalignment occurs, and intended planarization by the metal CMP process is performed.

Figure 13:
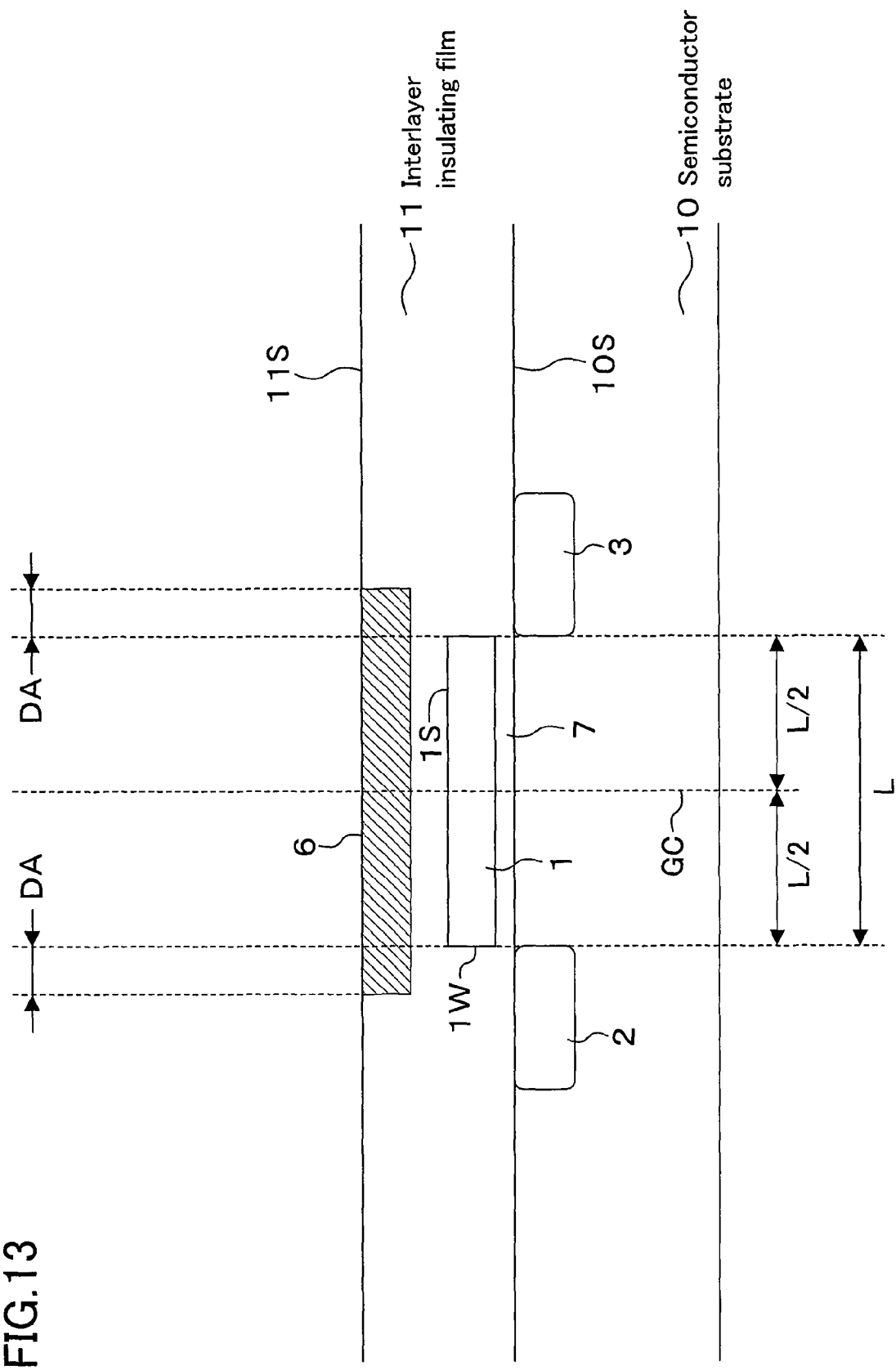
FIG. 13 is a sectional view of an example of the semiconductor device of Embodiment 3 in which copper is used as a wiring material.
Figure 14:
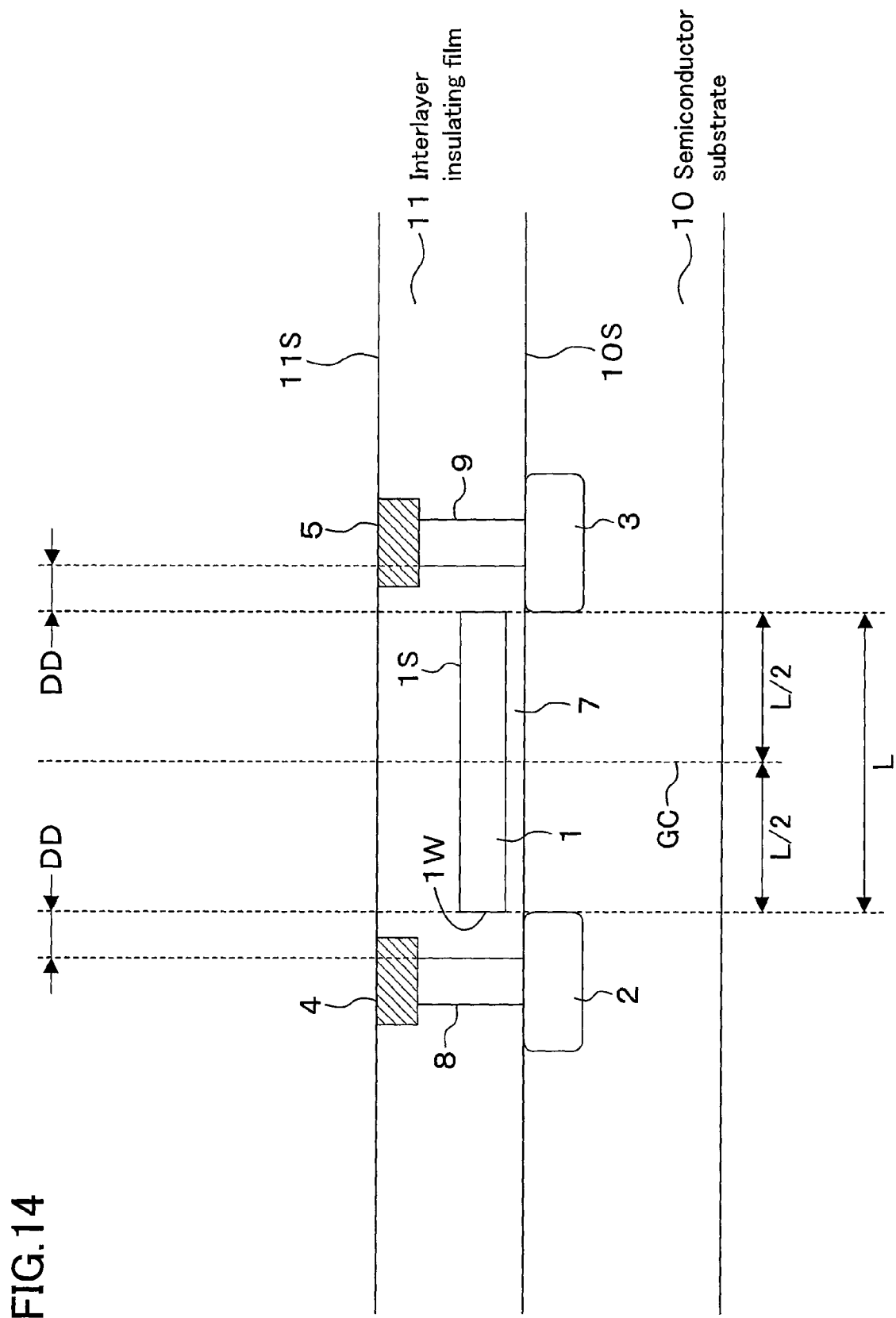
FIG. 14 is a sectional view illustrating the example of the semiconductor device of Embodiment 3 in which copper is used as a wiring material.

If the wiring material is replaced with copper in the transistors of Embodiments 2 and 3, the same effects as those obtained in Embodiments 2 and 3 are obtained. FIGS. 13 and 14 are longitudinal sections of an example of Embodiment 3 in which the wiring material is replaced with copper. FIG. 13 is a longitudinal section taken along the line A5-A6 shown in FIG. 7 and FIG. 14 is a sectional view taken along the line A7-A8 shown in FIG. 7.

Examples of Circuits to which the Present Invention is Applicable

The MOS transistors described in the embodiments are applicable to various kinds of transistors in circuits. In particular, the MOS transistors are effectively used as a differential pair in an analog circuit or transistors providing a current mirror pair.

Figure 15:
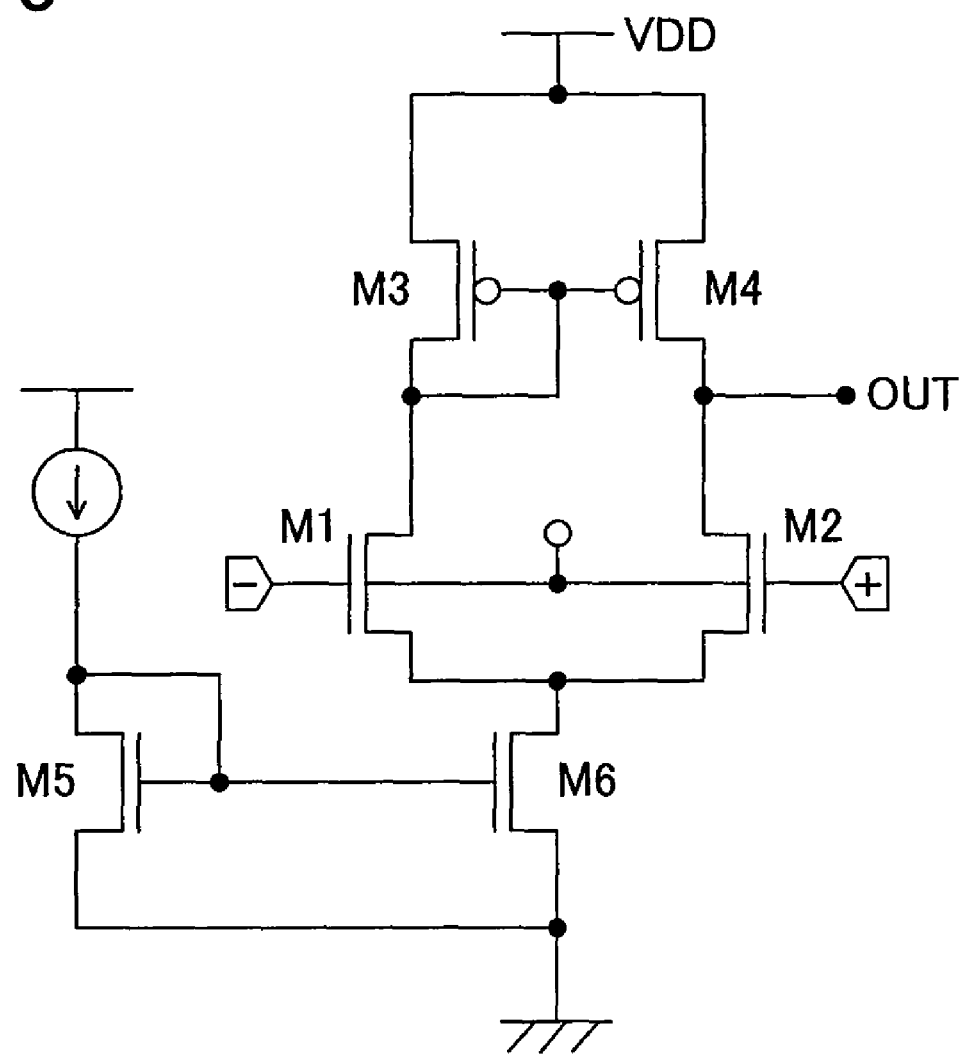
FIG. 15 is a diagram illustrating the structure of a differential amplifier circuit.

FIG. 15 is a diagram illustrating the structure of a differential amplifier circuit. In the circuit diagram shown in FIG. 15, the above-described MOS transistors are used as a differential pair M1 and M2. As a result, the degrees of characteristic degradation due to the dummy metal fill become uniform between the transistors acting as the differential pair M1 and M2. Therefore, offset voltage is expected to be reduced. Further, when the MOS transistors are used as a current mirror pair M5 and M6, the degrees of characteristic deterioration due to the dummy metal fill become uniform between the transistors acting as the current mirror pair M5 and M6. Therefore, offset voltage is expected to be reduced. It should be noted that FIG. 15 shows only an example of the circuit diagram. The MOS transistors may also be applicable to other analog circuits including the differential pair or the current mirror pair.

Embodiment 4

A semiconductor device according to Embodiment 4 of the present invention is described with reference to FIGS. 16 to 18.

Figure 16:
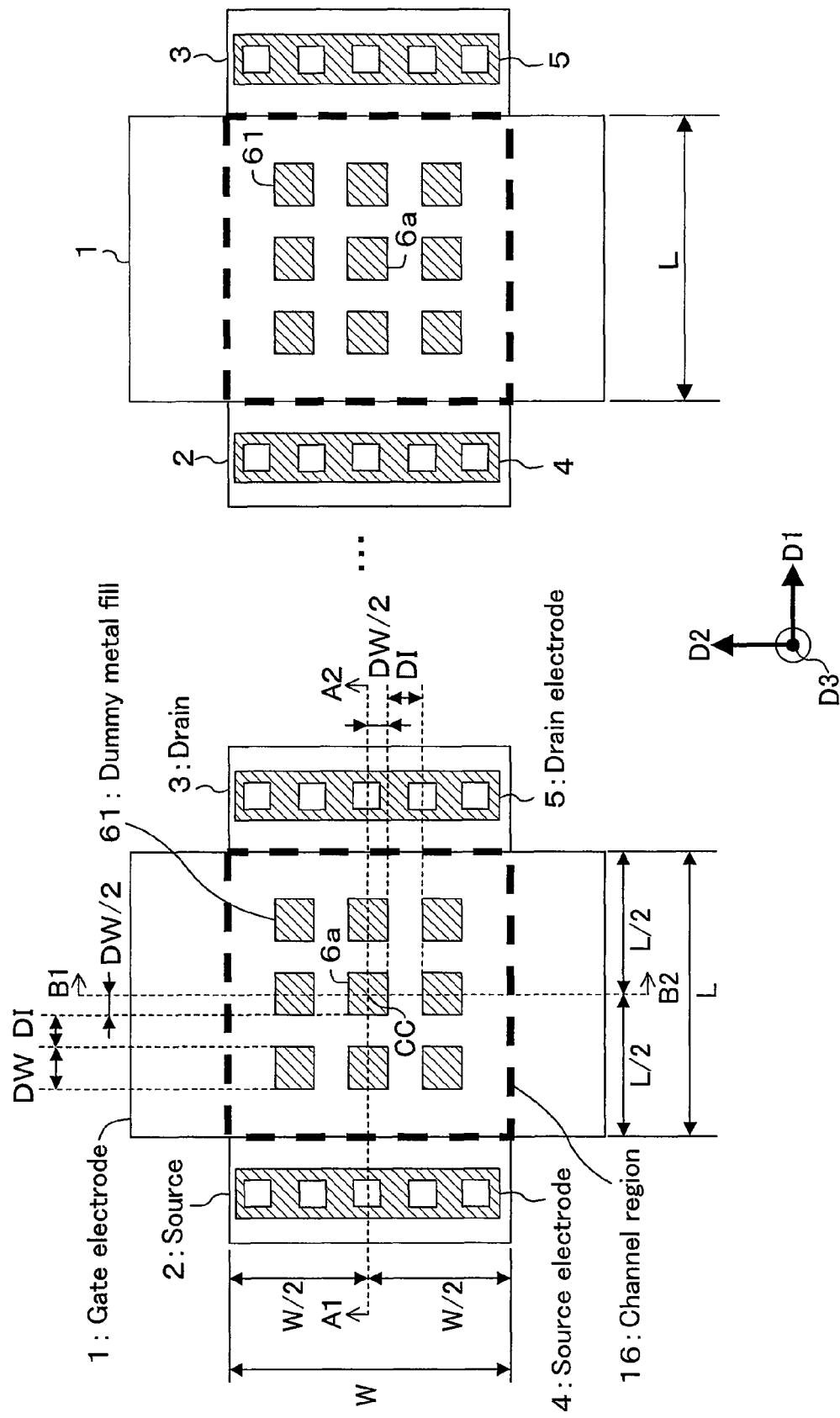
FIG. 16 is a plan view illustrating a semiconductor device according to Embodiment 4 of the present invention.

FIG. 16 is a plan view illustrating MOS transistors in a semiconductor device according to the present embodiment. Referring to FIG. 16, a channel region 16 is a region encircled by a thick broken line. A geometrical center CC of the channel region 16 is an intersection of a line connecting midpoints A1 and A2 of a channel width W and a line connecting midpoints B1 and B2 of a channel length L. This is also a geometrical center of the MOS transistor.

In the channel region 16, a dummy metal fill 61 consisting of a plurality of dummy metal segments is provided. For example, each of the dummy metal segments has a square shape with a length of each side being shorter than the channel width W and the channel length L. The dummy metal segments are arranged in point symmetry with respect to the geometrical center CC of the channel region 16. In this case, the geometrical center of the plurality of dummy metal segments coincides with the geometrical center CC of the channel region 16. Referring to FIG. 16, a geometrical center of a dummy metal segment 6a, which is one of the dummy metal segments, coincides with the geometrical center CC of the channel region 16. The other dummy metal segments are regularly arranged in the channel region 16 at regular intervals DI from the dummy metal segment 6a in the directions D1 and D2. That is, the dummy metal segments forming the dummy metal fill 61 are spread on the channel region 16 in point symmetry with respect to the geometric center CC of the channel region 16.

Figure 17:
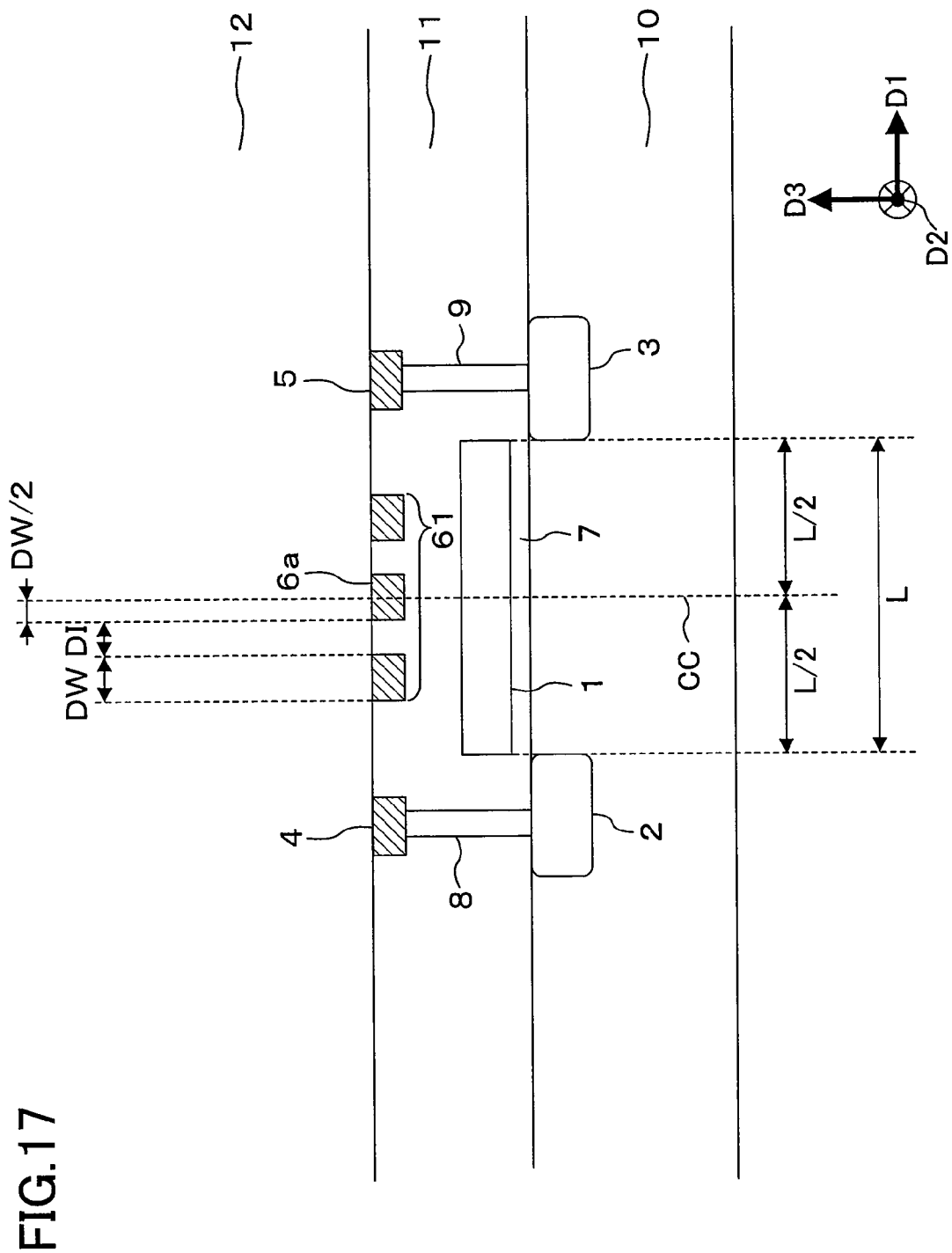
FIG. 17 is a longitudinal section taken along the line A1-A2 shown in FIG. 16.

FIG. 17 is a longitudinal section taken along the line A1-A2 drawn on the MOS transistor shown in FIG. 16. As shown in FIG. 17, a source electrode 4 is formed in a top portion of an interlayer insulating film 11 located above a source region 2. The source electrode 4 is connected to the source region 2 via a source contact hole 8. In the similar manner, a drain electrode 5 is formed in a top portion of the interlayer insulating film 11 located above a drain region 3. The drain electrode 5 is connected to the drain region 3 via a drain contact hole 9. The dummy metal fill 61 consisting of a plurality of dummy metal segments is formed in a top portion of the interlayer insulating film 11. The thickness of the dummy metal fill 61 in the direction D3 is equal to the thicknesses of the source electrode 4 and the drain electrode 5.

Figure 18:
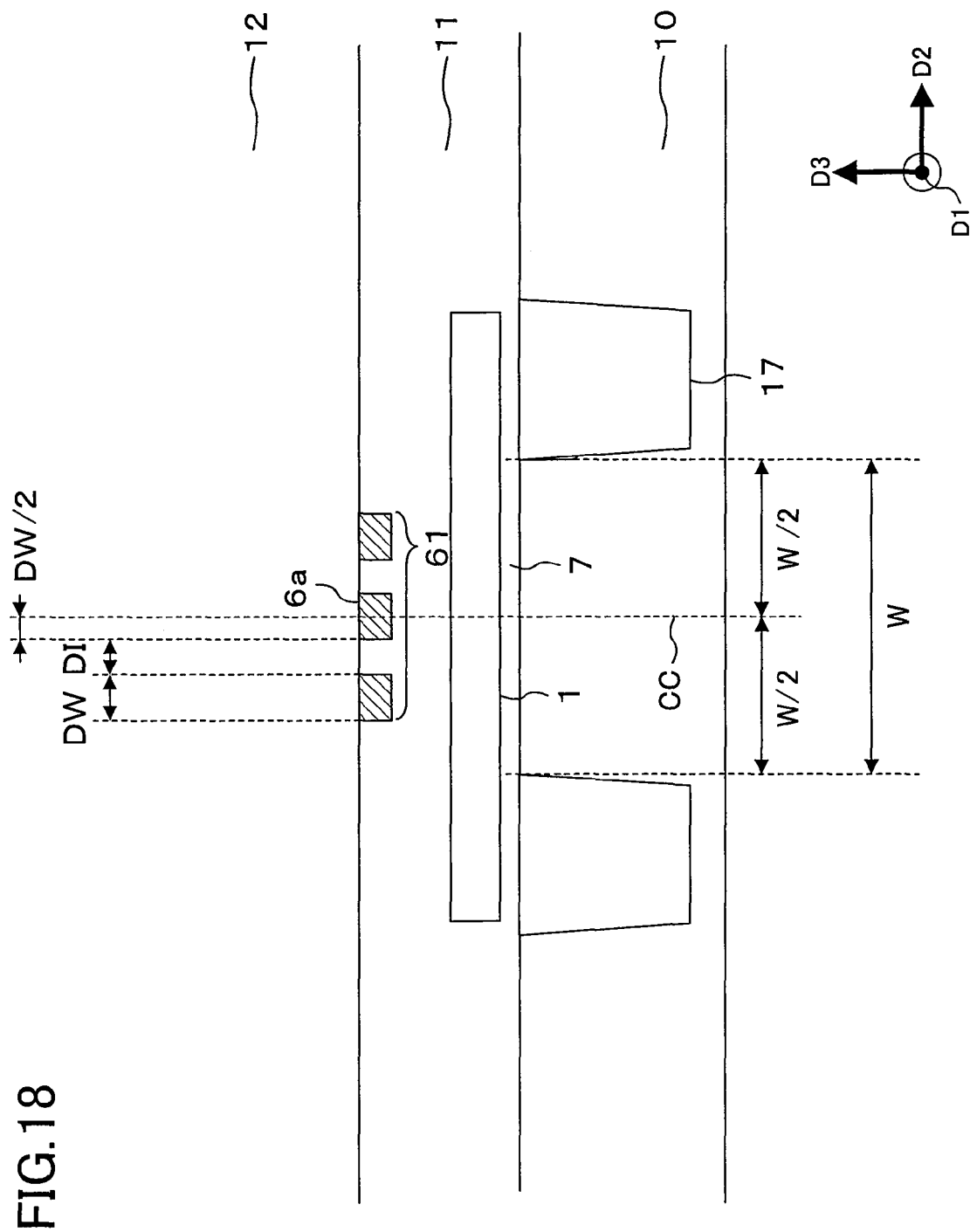
FIG. 18 is a longitudinal section taken along the line B1-B2 shown in FIG. 16.

FIG. 18 is a longitudinal section taken along the line B1-B2 shown in FIG. 16. Reference numeral 17 indicates an STI (Shallow Trench Isolation) region formed in a substrate 10 for device isolation.

In this embodiment, the dummy metal fill 61 consisting of a plurality of dummy metal segments is used in place of a conventional dummy metal fill made of a single metal segment. Therefore, even if the channel region 16 is enlarged, the width DW of each dummy metal segment is not increased. Thus, dishing (excessive polish) is less likely to occur and increase of parasitic resistance of adjacent source and drain electrodes is restrained, and of course, the intended planarizing effect of the metal CMP process is ensured. Further, the geometrical center of the dummy metal segment 6a of the dummy metal fill 61 coincides with the geometric center CC of the channel region 16. Therefore, even in the presence of the dummy metal fill 61 required for planarizing the channel region 16, the degrees of characteristic degradation of the MOS transistors due to the dummy metal fill 61 are made uniform.

Embodiment 5

A semiconductor device according to Embodiment 5 of the present invention is described with reference to FIGS. 19 and 20.

Figure 19:
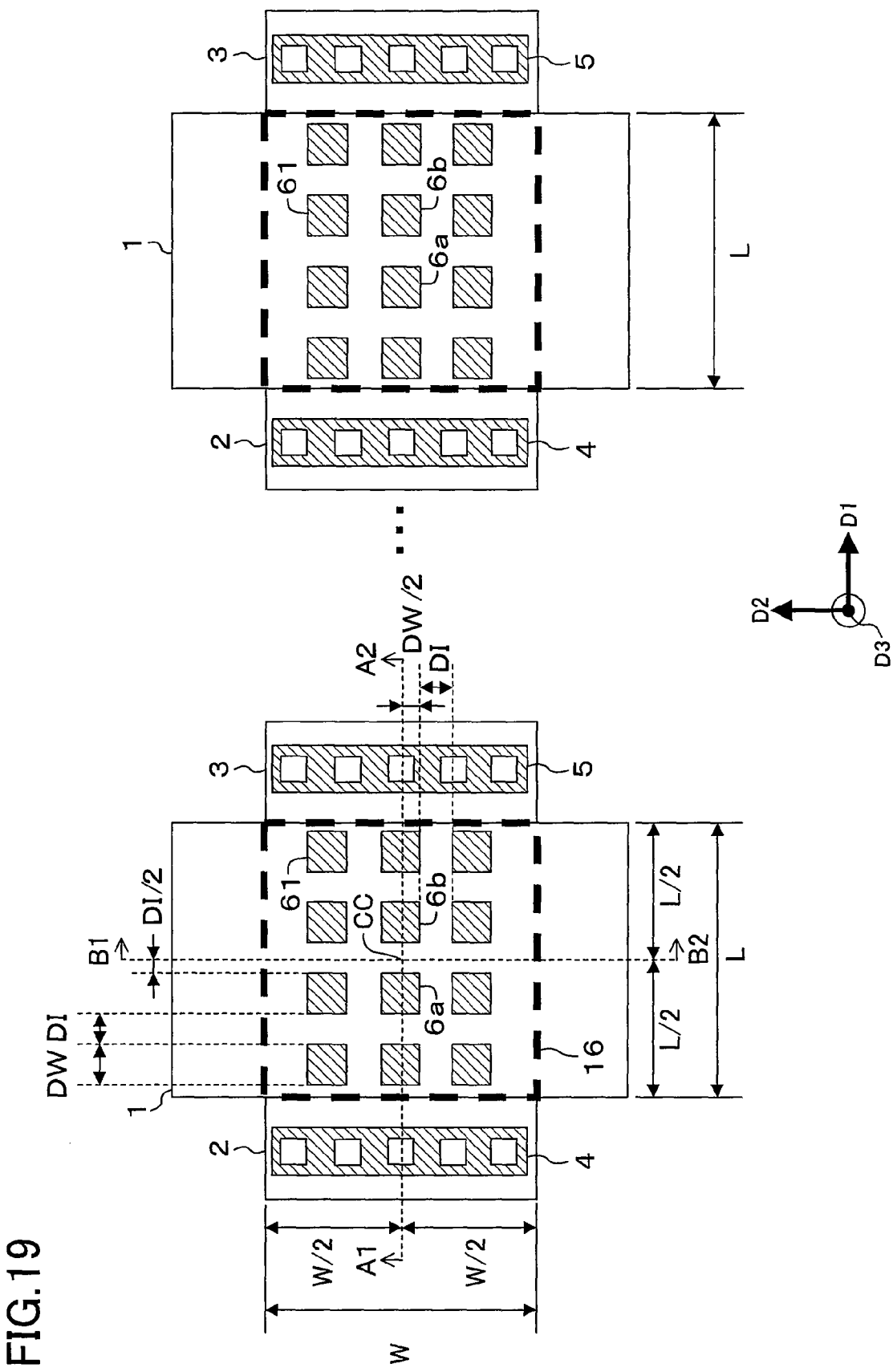
FIG. 19 is a plan view illustrating a semiconductor device according to Embodiment 5 of the present invention.
Figure 20:
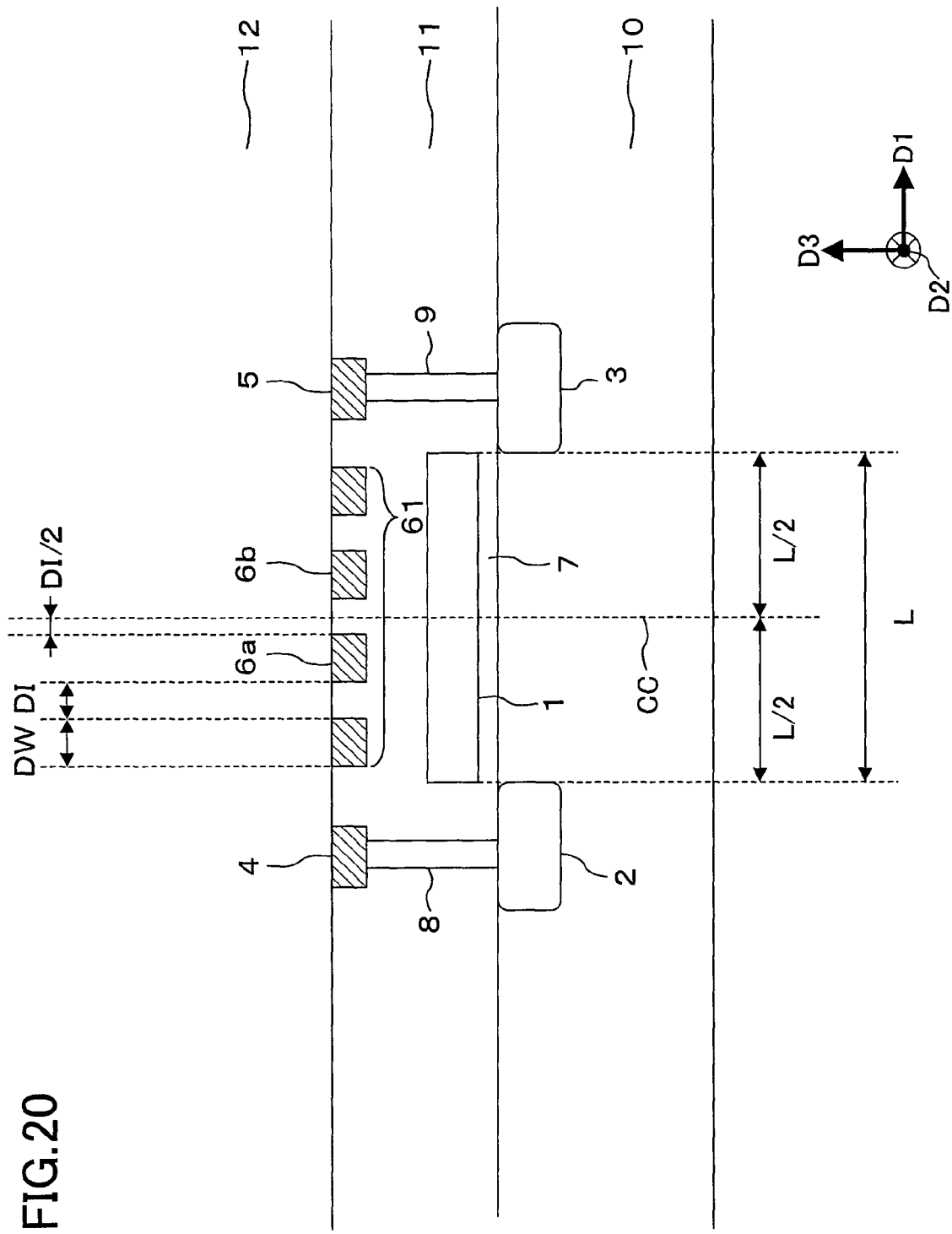
FIG. 20 is a longitudinal section taken along the line A1-A2 shown in FIG. 19.

FIG. 19 is a plan view illustrating MOS transistors in a semiconductor device according to the present embodiment. FIG. 20 is a longitudinal section taken along the line A1-A2 shown in FIG. 19. The present embodiment is a variant of Embodiment 4 in which the layout of the dummy metal segments is changed. For example, as shown in FIG. 19, a midpoint of a line connecting the geometrical centers of dummy metal segments 6a and 6b of the dummy metal fill 61 coincides with the geometrical center CC of the channel region 16. The other features of Embodiment 5 are the same as those of Embodiment 4 and therefore the detailed explanation is omitted.

According to the present embodiment, the MOS transistors are configured in the same manner as those of Embodiment 4 except the layout of the dummy metal fill 61. Therefore, similar to Embodiment 4, the width DW of each dummy metal segment is not increased even if the channel region 16 is enlarged. Thus, dishing (excessive polish) is less likely to occur and increase of parasitic resistance of adjacent source and drain electrodes is restrained, and of course, the intended planarizing effect of the metal CMP process is ensured. Further, a midpoint of a line connecting the geometrical centers of the dummy metal segments 6a and 6b of the dummy metal fill 61 coincides with the geometric center CC of the channel region 16. Therefore, even in the presence of the dummy metal fill 61 required for planarizing the channel region 16, the degrees of characteristic degradation of the MOS transistors due to the dummy metal fill 61 are made uniform. Thus, Embodiment 5 offers the same effect as that of Embodiment 4.

Embodiment 6

A semiconductor device according to Embodiment 6 of the present invention is described with reference to FIGS. 21 and 22.

Figure 21:
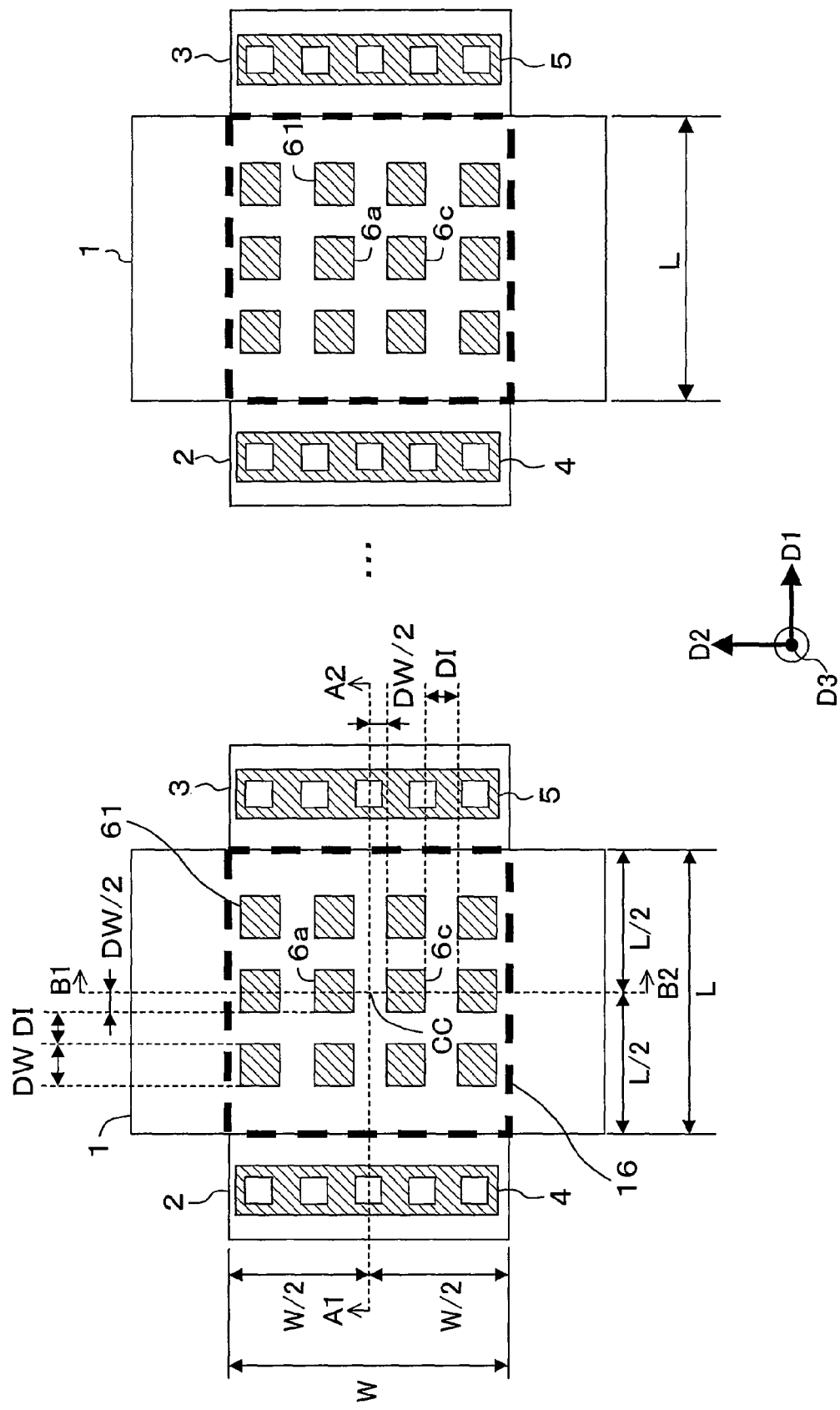
FIG. 21 is a plan view illustrating a semiconductor device according to Embodiment 6 of the present invention.
Figure 22:
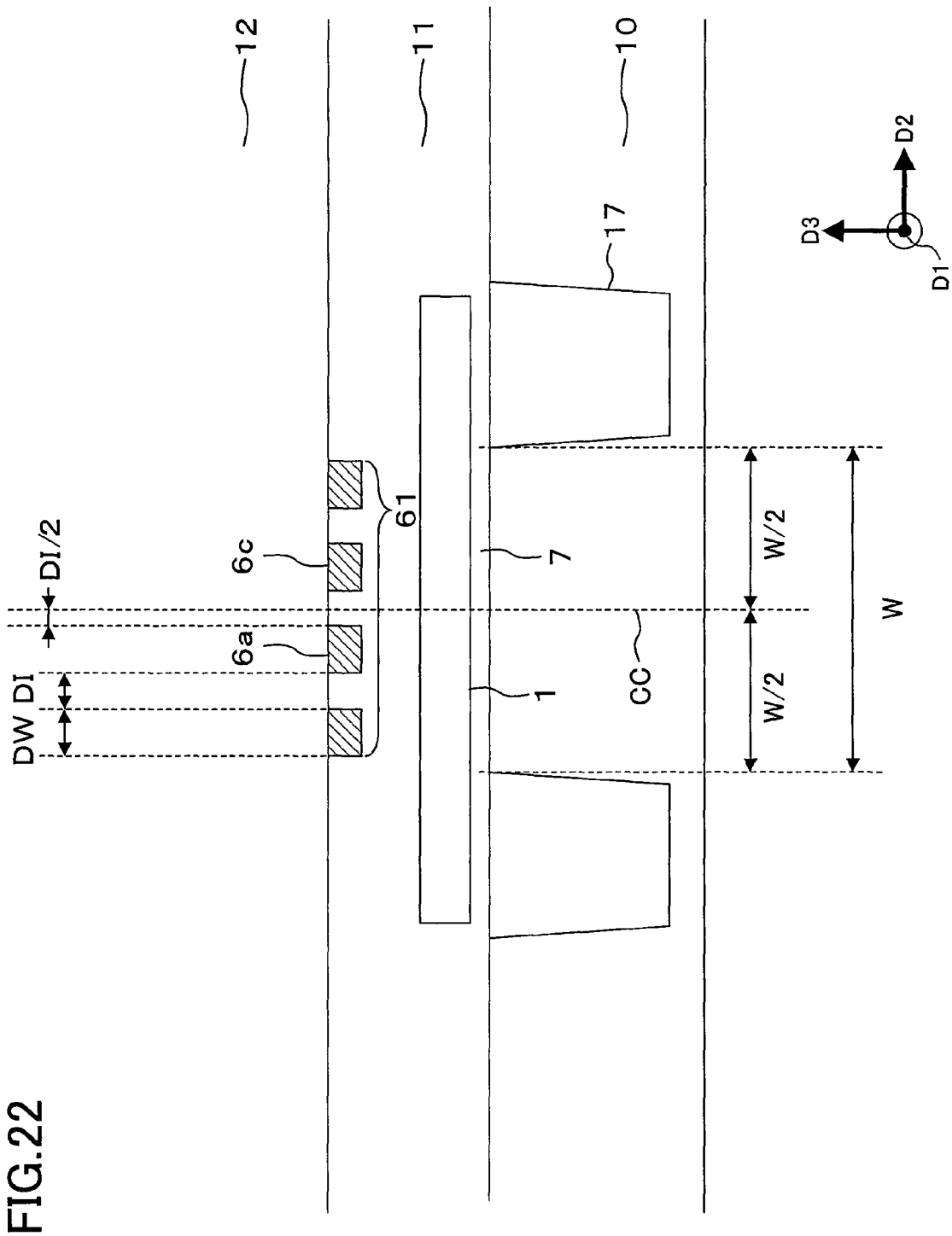
FIG. 22 is a longitudinal section taken along the line B1-B2 shown in FIG. 21.

FIG. 21 is a plan view illustrating MOS transistors in a semiconductor device according to the present embodiment. FIG. 22 is a longitudinal section taken along the line B1-B2 shown in FIG. 21. Just like Embodiment 5, the present embodiment is a variant of Embodiment 4 in which the layout of the dummy metal segments is changed. For example, as shown in FIG. 21, a midpoint of a line connecting the geometrical centers of dummy metal segments 6a and 6c of the dummy metal fill 61 coincides with the geometrical center CC of the channel region 16. The other features of Embodiment 6 are the same as those of Embodiment 4 and therefore the detailed explanation is omitted.

According to the present embodiment, the MOS transistors are configured in the same manner as those of Embodiment 4 except the layout of the dummy metal fill 61. Therefore, similar to Embodiment 4, the width of each dummy metal segment is not increased even if the channel region 16 is enlarged. Thus, dishing (excessive polish) is less likely to occur and increase of parasitic resistance of adjacent source and drain electrodes is restrained, and of course, the intended planarizing effect of the metal CMP process is ensured. Further, a midpoint of a line connecting the geometrical centers of the dummy metal segments 6a and 6c of the dummy metal fill 61 coincides with the geometric center CC of the channel region 16. Therefore, even in the presence of the dummy metal fill 61 required for planarizing the channel region 16, the degrees of characteristic degradation of the MOS transistors due to the dummy metal fill 61 are made uniform. Thus, Embodiment 6 offers the same effect as that of Embodiment 4.

Embodiment 7

A semiconductor device according to Embodiment 7 of the present invention is described with reference to FIG. 23.

Figure 23:
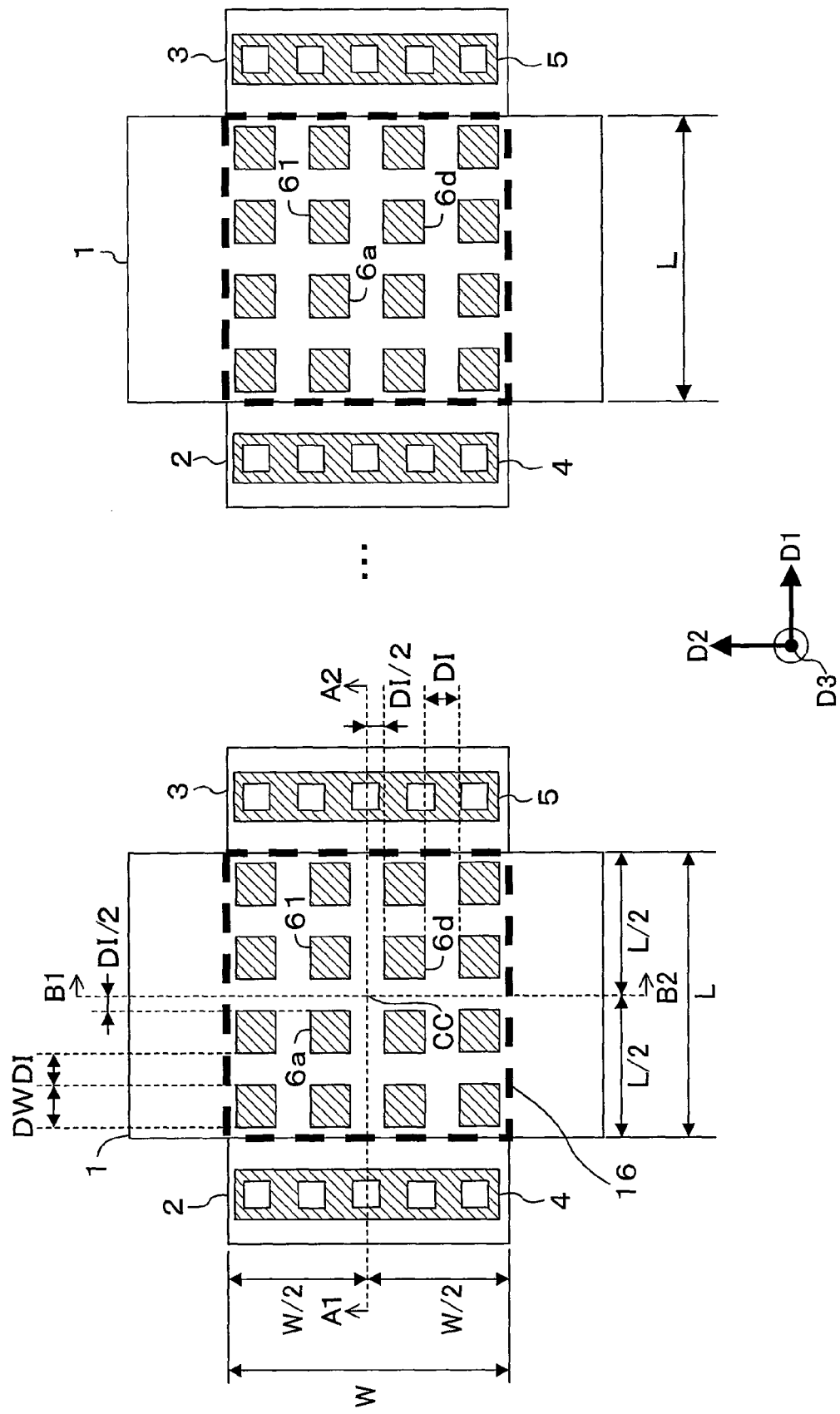
FIG. 23 is a plan view illustrating a semiconductor device according to Embodiment 7 of the present invention.

FIG. 23 is a plan view illustrating MOS transistors according to the present embodiment. Just like Embodiments 5 and 6, the present embodiment is a variant of Embodiment 4 in which the layout of the dummy metal segments is changed. For example, as shown in FIG. 23, a midpoint of a line connecting the geometrical centers of dummy metal segments 6a and 6d of the dummy metal fill 61 coincides with the geometrical center CC of the channel region 16. The other features of Embodiment 7 are the same as those of Embodiment 4 and therefore the detailed explanation is omitted.

According to the present embodiment, the MOS transistors are configured in the same manner as that of Embodiment 4 except the layout of the dummy metal fill 61. Therefore, similar to Embodiment 4, the width DW of each dummy metal segment is not increased even if the channel region 16 is enlarged. Thus, dishing (excessive polish) is less likely to occur and increase of parasitic resistance of adjacent source and drain electrodes is restrained, and of course, the original planarizing effect of the metal CMP process is ensured. Further, a midpoint of a line connecting the geometrical centers of the dummy metal segments 6a and 6d of the dummy metal fill 61 coincides with the geometric center CC of the channel region 16. Therefore, even in the presence of the dummy metal fill 61 required for planarizing the channel region 16, the degrees of characteristic degradation of the MOS transistors caused by the dummy metal fill 61 are made uniform. Thus, Embodiment 7 offers the same effect as that of Embodiment 4.

Embodiment 8

Figure 25:
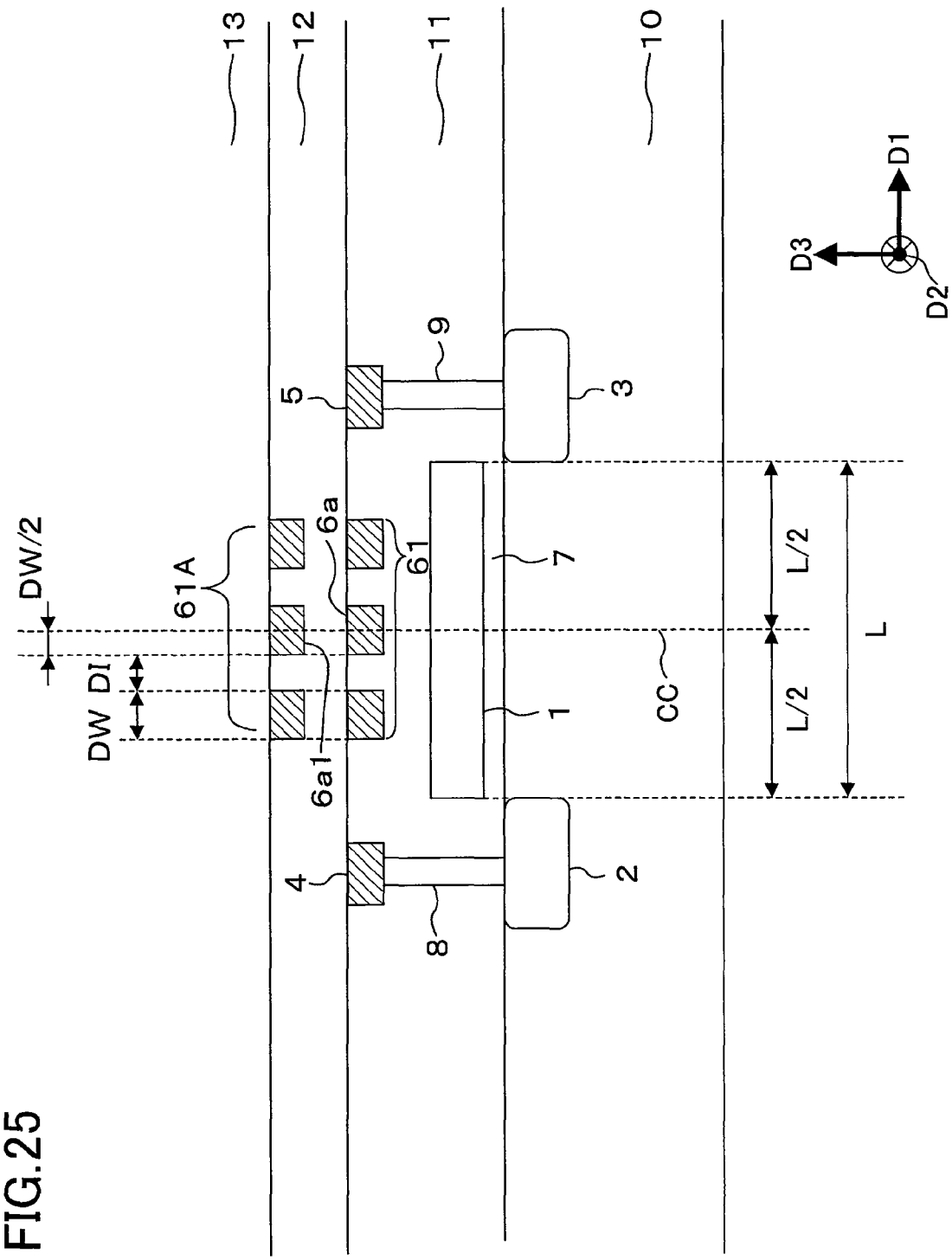
FIG. 25 is a longitudinal section taken along the line A1-A2 shown in FIG. 24.
Figure 26:
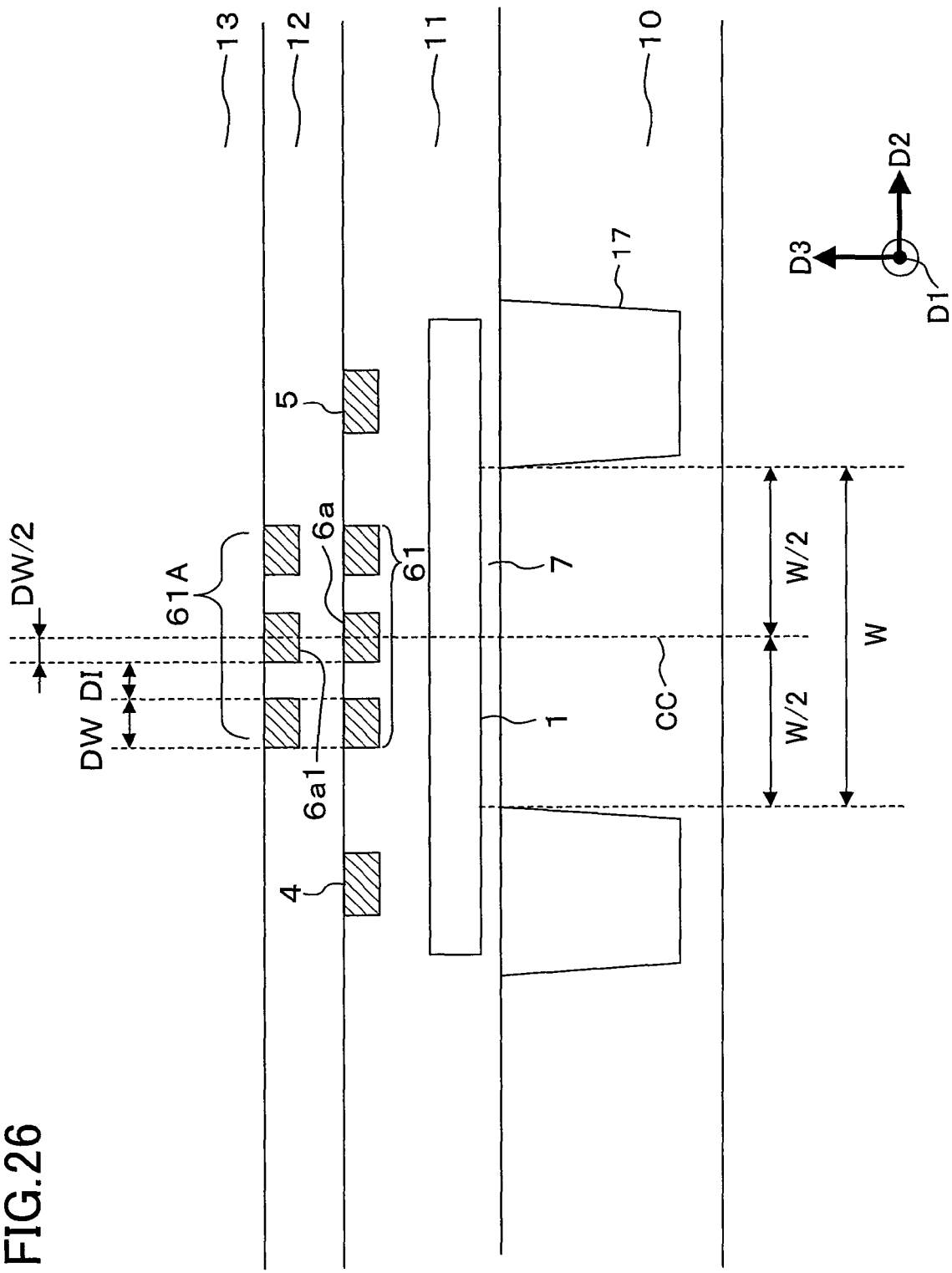
FIG. 26 is a longitudinal section taken along the line B1-B2 shown in FIG. 24.

A semiconductor device according to Embodiment 8 of the present invention is described with reference to FIGS. 24 to 26.

Figure 24:
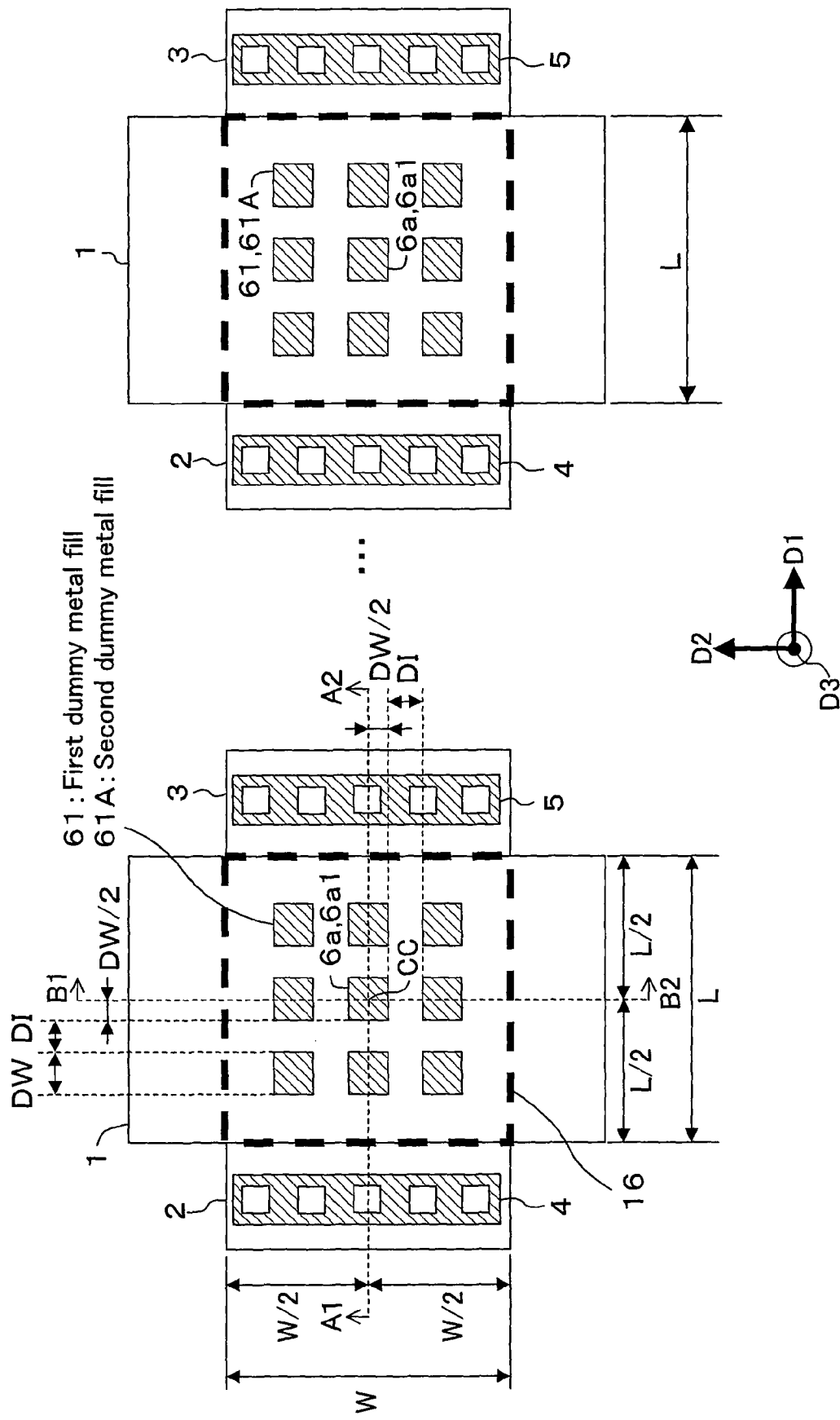
FIG. 24 is a plan view illustrating a semiconductor device according to Embodiment 8 of the present invention.

FIG. 24 is a plan view illustrating MOS transistors in a semiconductor device according to the present embodiment. FIG. 25 is a longitudinal section taken along the line A1-A2 shown in FIG. 24. FIG. 26 is a longitudinal section taken along the line B1-B2 shown in FIG. 24. According to the present embodiment, a second dummy metal fill 61A is provided above the MOS transistors of Embodiment 4.

Specifically, in the present embodiment, the second dummy metal fill 61A is provided in a top portion of a second interlayer insulating film 12 in the channel region 16 of the semiconductor device of Embodiment 4. The second dummy metal fill 61A consists of a plurality of dummy metal segments each having a square shape with a length DW of each side being shorter than the channel width W and the channel length L. The dummy metal segments of the second dummy metal fill 61A are arranged in point symmetry with respect to the geometric center CC of the channel region 16. In this case, the geometrical center of the dummy metal segments coincides with the geometric center CC of the channel region 16. Referring to FIG. 24, the geometrical centers of dummy metal segments 6a and 6a 1 coincide with the geometric center CC of the channel region 16. The other dummy metal segments are regularly arranged to have regular intervals DI from the dummy metal segments 6a and 6a 1 in the directions D1 and D2.

The present embodiment is configured in the same manner as Embodiment 4 except that the dummy metal fill is provided in two layers. Therefore, similar to Embodiment 4, the width DW of each dummy metal segment is not increased even if the channel region 16 is enlarged. Thus, dishing (excessive polish) is less likely to occur and increase of parasitic resistance of adjacent source and drain electrodes is restrained, and of course, the intended planarizing effect of the metal CMP process is ensured. Further, the geometrical centers of the dummy metal segments 6a and 6a1 of the dummy metal fills 61 and 61A coincide with the geometric center CC of the channel region 16. Therefore, even in the presence of the dummy metal fills 61 and 61A required for planarizing the channel region 16, the degrees of characteristic degradation of the MOS transistors due to the dummy metal fills 61 and 61A are made uniform. Thus, Embodiment 8 offers the same effect as that of Embodiment 4.

Even when the multiple wiring layers are stacked as described above, the degrees of characteristic degradation of the MOS transistors due to the dummy metal fills provided in the wiring layers are made uniform, and at the same time, the intended planarizing effect of the metal CMP process is ensured.

In this embodiment, the layout of the dummy metal fill according to Embodiment 4 is used for the first and second dummy metal fills. However, the layout of any one of Embodiments 5 to 7 may be used.

Further, in this embodiment, the layouts of the first and second dummy metal fills are the same. However, their layouts may not always be the same. Specifically, the layouts of the first and second dummy metal fills may be varied as long as the dummy metal segments in each of the dummy metal fills are arranged in point symmetry with respect to the geometrical center of the channel region.

Embodiment 9

Figure 28:
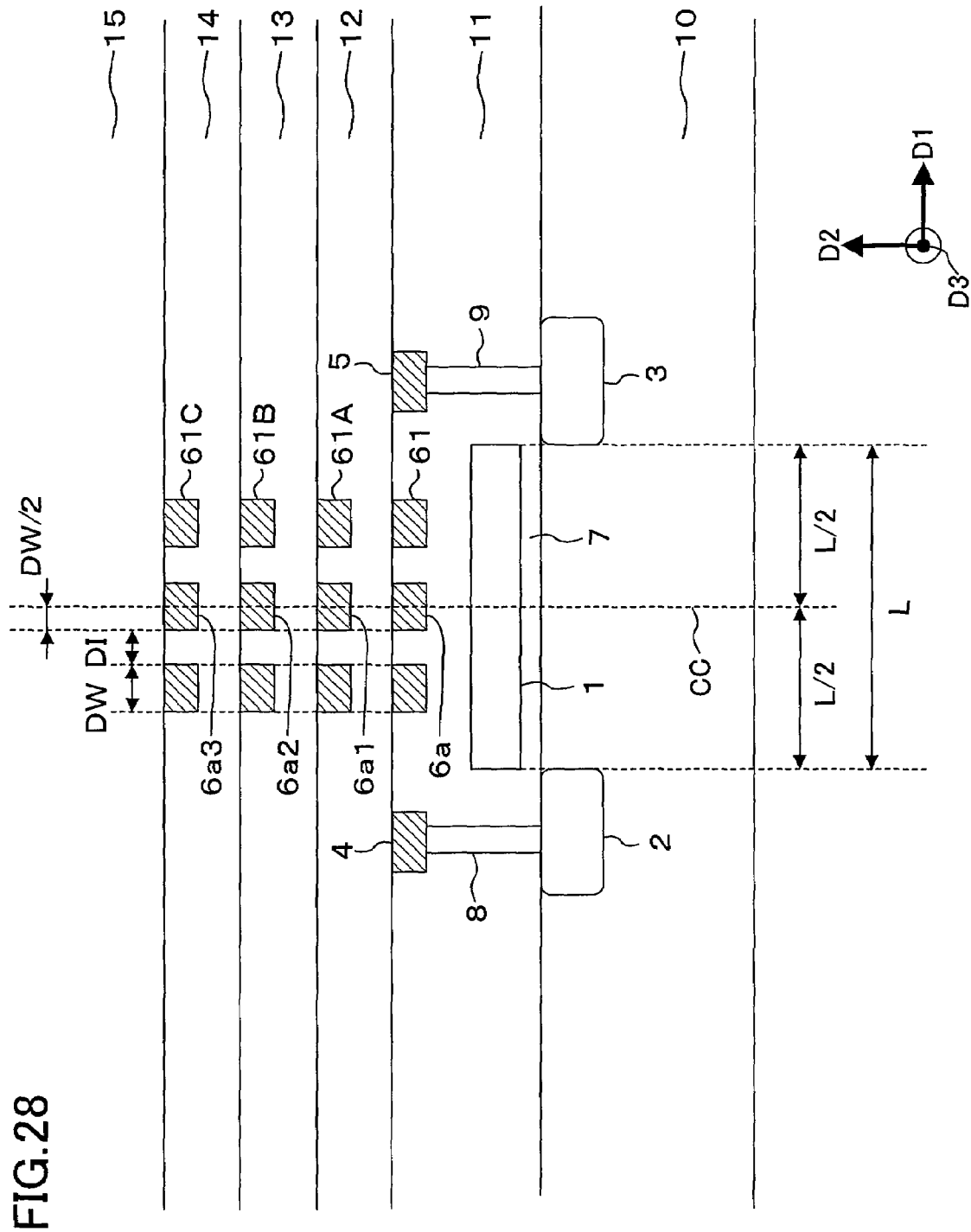
FIG. 28 is a longitudinal section taken along the line A1-A2 shown in FIG. 27.
Figure 29:
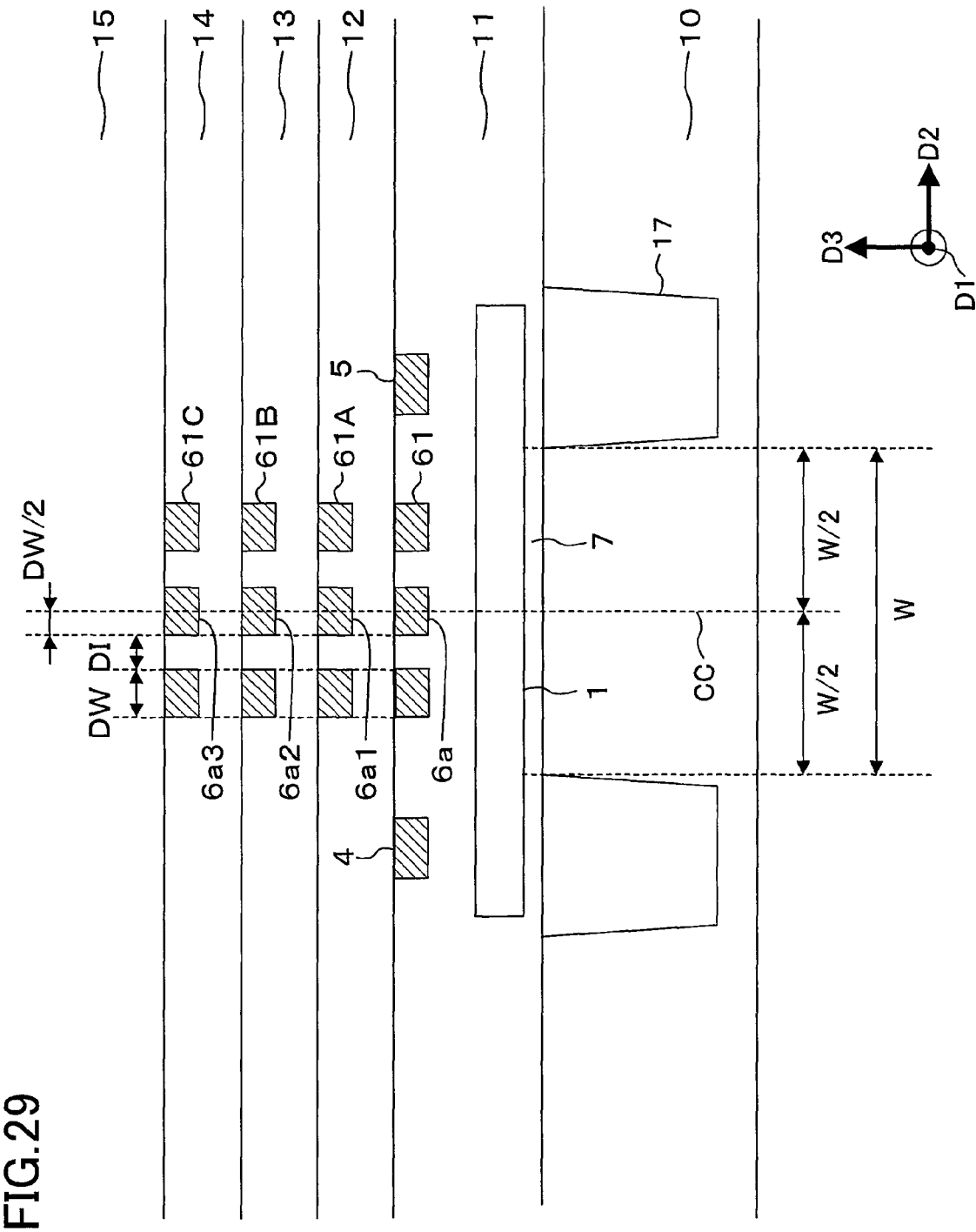
FIG. 29 is a longitudinal section taken along the line B1-B2 shown in FIG. 27.

A semiconductor device according to Embodiment 9 of the present invention is described with reference to FIGS. 27 to 29.

Figure 27:
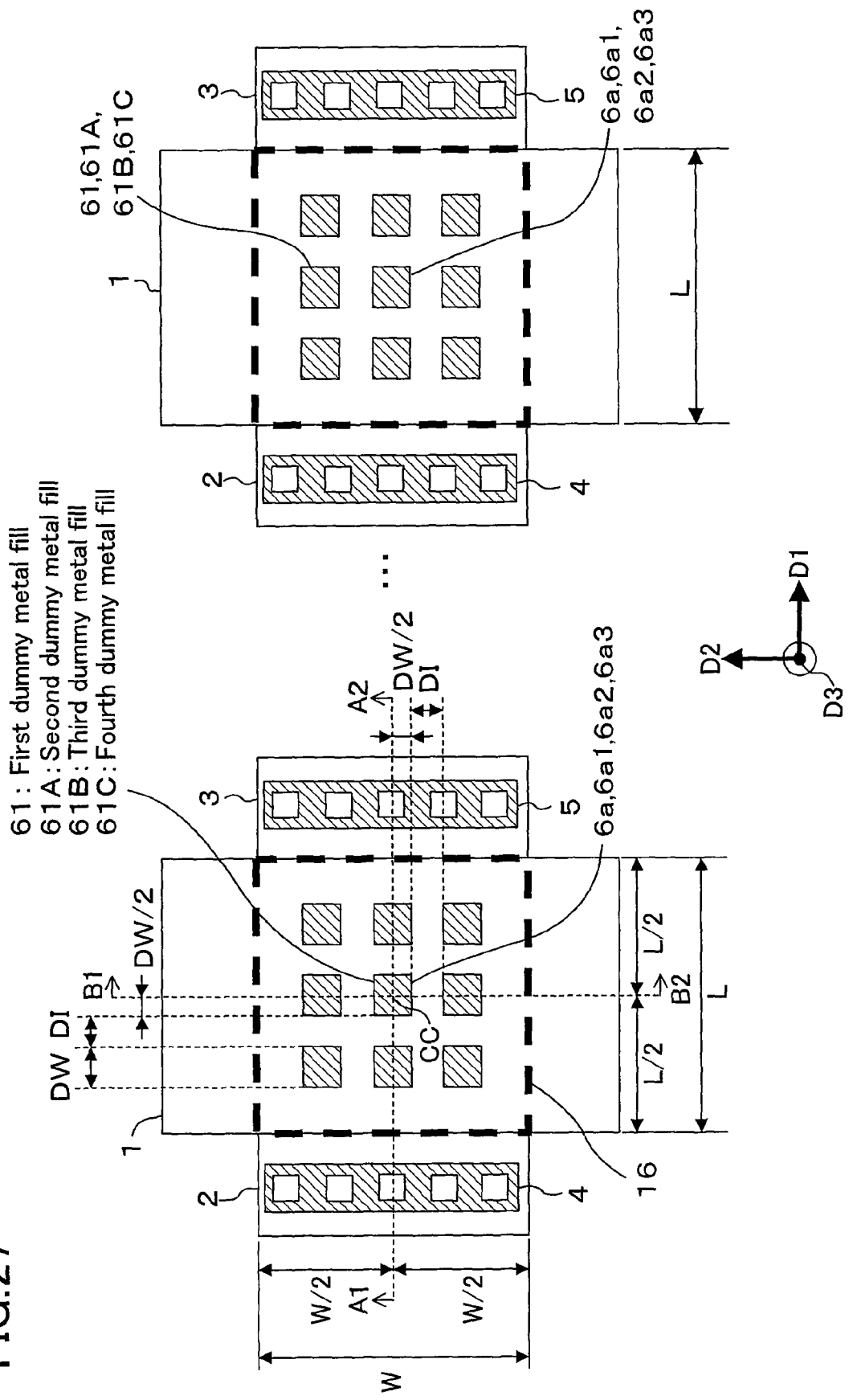
FIG. 27 is a plan view illustrating a semiconductor device according to Embodiment 9 of the present invention.

FIG. 27 is a plan view illustrating MOS transistors in a semiconductor device according to the present embodiment. FIG. 28 is a longitudinal section taken along the line A1-A2 shown in FIG. 27. FIG. 29 is a longitudinal section taken along the line B1-B2 shown in FIG. 27. According to the present embodiment, two dummy metal fills 61B and 61C each consisting of a plurality of dummy metal segments are additionally stacked above the MOS transistors of Embodiment 8.

Specifically, in the present embodiment, a third dummy metal fill 61B is provided in a top portion of a third interlayer insulating film 13 in the channel region 16 of the semiconductor device of Embodiment 8. The third dummy metal fill 61B consists of a plurality of dummy metal segments each having a square shape with a length DW of each side being shorter than the channel width W and the channel length L. Further, a fourth dummy metal fill 61C is provided in a top portion of a fourth interlayer insulating film 14 in the channel region 16. The fourth dummy metal fill 61C also consists of a plurality of dummy metal segments each having a square shape with a length DW of each side being shorter than the channel width W and the channel length L. In the third and fourth dummy metal fills 61B and 61C, the dummy metal segments are arranged at regular intervals in point symmetry with respect to the geometric center CC of the channel region 16. In this case, the geometrical center of the dummy metal segments coincides with the geometric center CC of the channel region 16. Referring to FIG. 27, the geometrical centers of the dummy metal segments 6a, 6a1, 6a2 and 6a3 coincide with the geometric center CC of the channel region 16. The other dummy metal segments are regularly arranged to have regular intervals DI from the dummy metal segments 6a, 6a1, 6a2 and 6a3 in the directions D1 and D2.

The present embodiment is configured in the same manner as Embodiment 4 except that the dummy metal fill is provided in three or more layers. Therefore, similar to Embodiment 4, the width DW of each dummy metal segment is not increased even if the channel region 16 is enlarged. Thus, dishing (excessive polish) is less likely to occur and increase of parasitic resistance of adjacent source and drain electrodes is restrained, and of course, the intended planarizing effect of the metal CMP process is ensured. Further, the geometrical centers of the dummy metal segments 6a, 6a1, 6a2 and 6a3 of the dummy metal fills 61, 61A, 61B and 61C coincide with the geometric center CC of the channel region 16. Therefore, even in the presence of the dummy metal fills 61, 61A, 61B and 61C required for planarizing the channel region 16, the degrees of characteristic degradation of the MOS transistors due to the dummy metal fills 61, 61A, 61B and 61C are made uniform. Thus, Embodiment 9 offers the same effect as that of Embodiment 4.

Even when the multiple wiring layers are stacked as described above, the degrees of characteristic degradation of the MOS transistors due to the dummy metal fills provided in the wiring layers are made uniform, and at the same time, the original planarizing effect of the metal CMP process is ensured.

In this embodiment, the layout of the dummy metal fill according to Embodiment 4 is used for the first to fourth dummy metal fills. However, the layout of any one of Embodiments 5 to 7 may be used.

Further, in this embodiment, the layouts of the first to fourth dummy metal fills are the same. However, their layouts may not always be the same. Specifically, the layouts of the first to fourth dummy metal fills may be varied as long as the dummy metal segments in each of the dummy metal fills are arranged in point symmetry with respect to the geometrical center of the channel region.

In Embodiments 8 and 9, the dummy metal fills may be connected to each other through via holes.

Embodiment 10

A semiconductor device according to Embodiment 10 of the present invention is described with reference to FIGS. 30 to 32.

Figure 30:
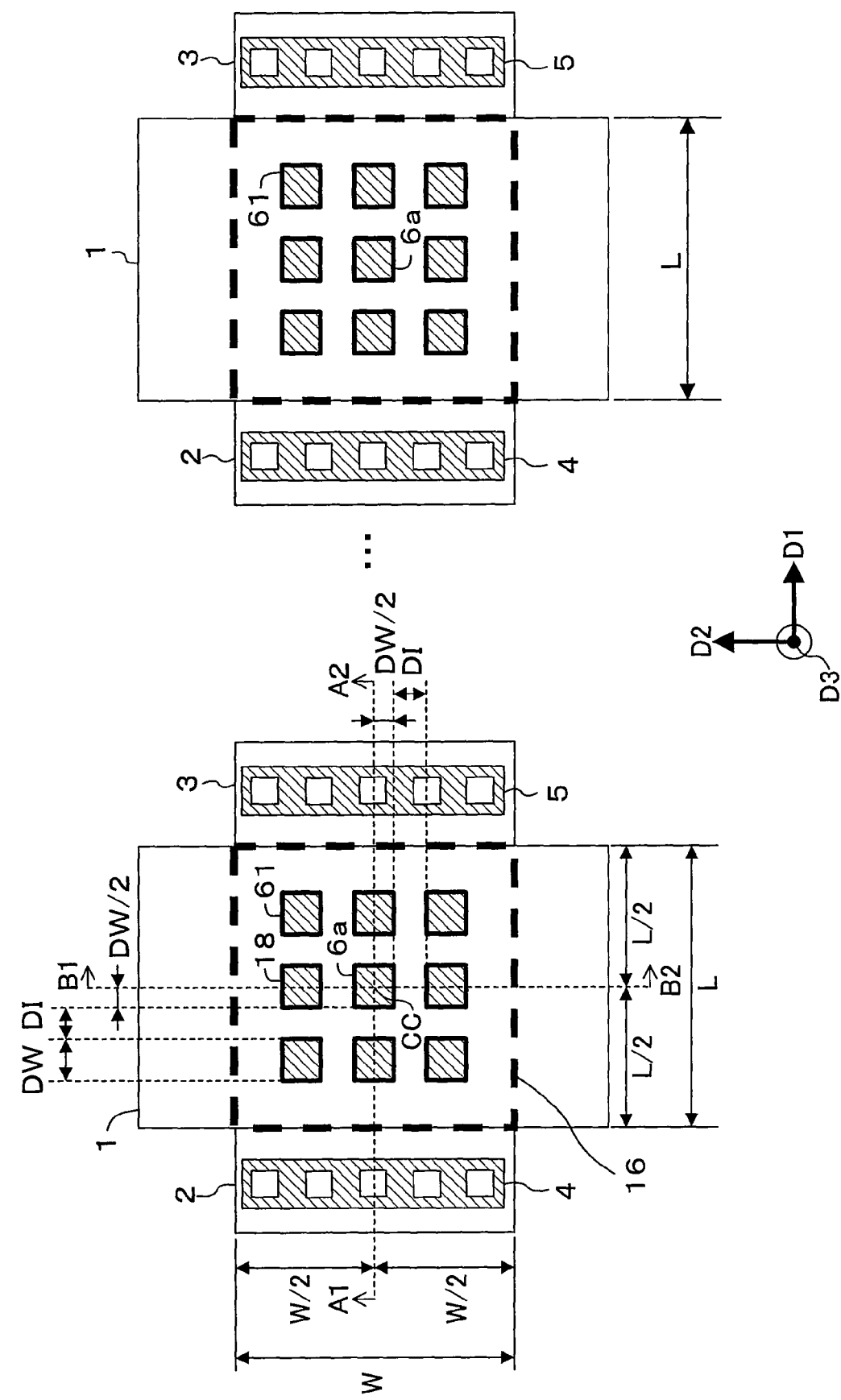
FIG. 30 is a plan view illustrating a semiconductor device according to Embodiment 10 of the present invention.

FIG. 30 is a plan view illustrating MOS transistors in a semiconductor device according to the present embodiment. FIG. 31 is a longitudinal section taken along the line A1-A2 shown in FIG. 30. FIG. 32 is a longitudinal section taken along the line B1-B2 shown in FIG. 30. According to the present embodiment, a barrier metal 18 is provided around each of the dummy metal segments forming the dummy metal fill 61 in the MOS transistors of Embodiment 4.

Examples of material for the barrier metal 18 include Ta, TaN, TiN and Ti. The barrier metal 18 may be harder than the interlayer insulating film in some cases. Therefore, when the channel region 16 is enlarged, the dishing (excessive polish) is more likely to occur as compared with the case where the barrier metal is not provided. However, the present embodiment is configured in the same manner as Embodiment 4 except the provision of the barrier metal 18. Therefore, the same effect as that obtained in Embodiment 4 is achieved.

Figure 31:
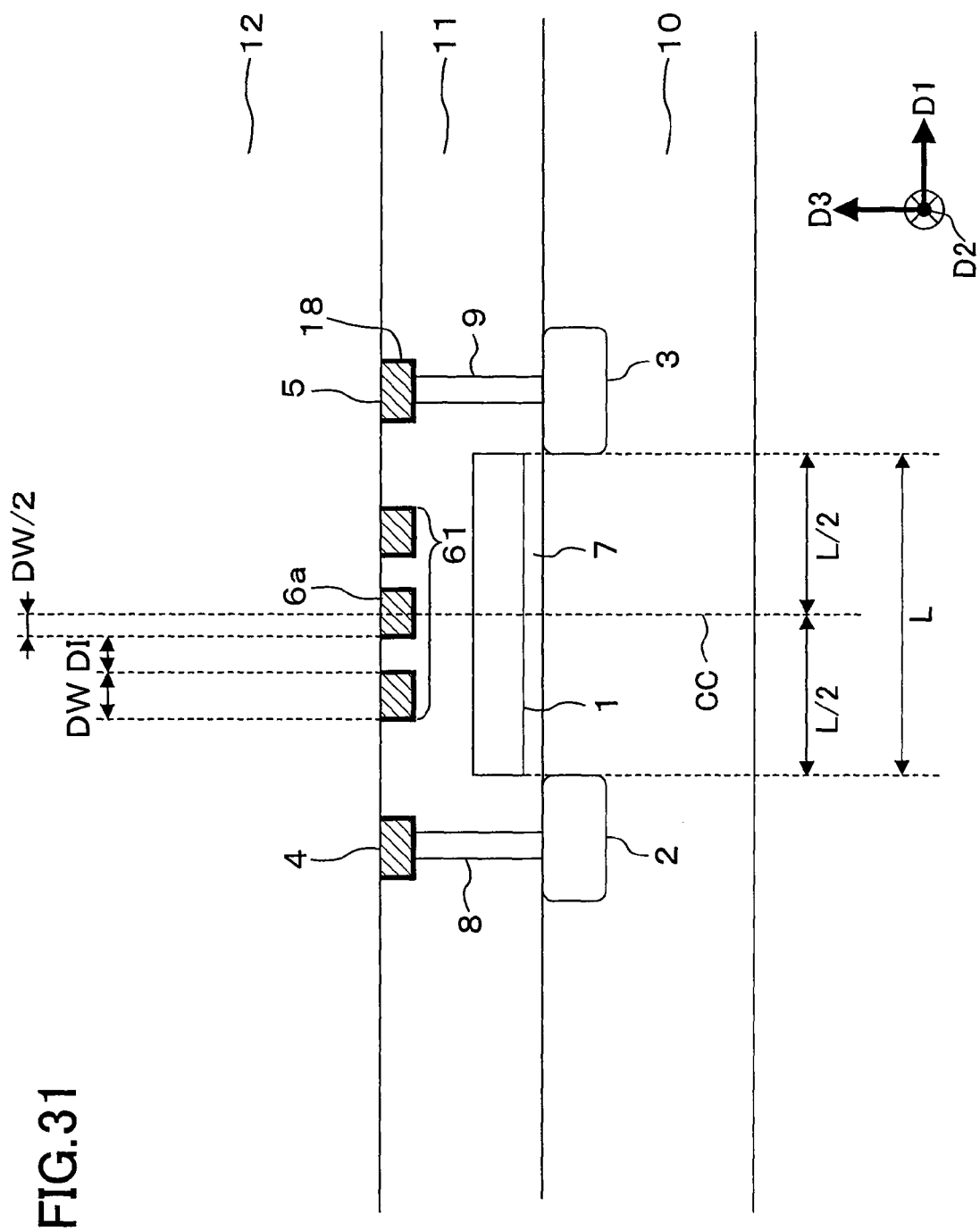
FIG. 31 is a longitudinal section taken along the line A1-A2 shown in FIG. 30.
Figure 32:
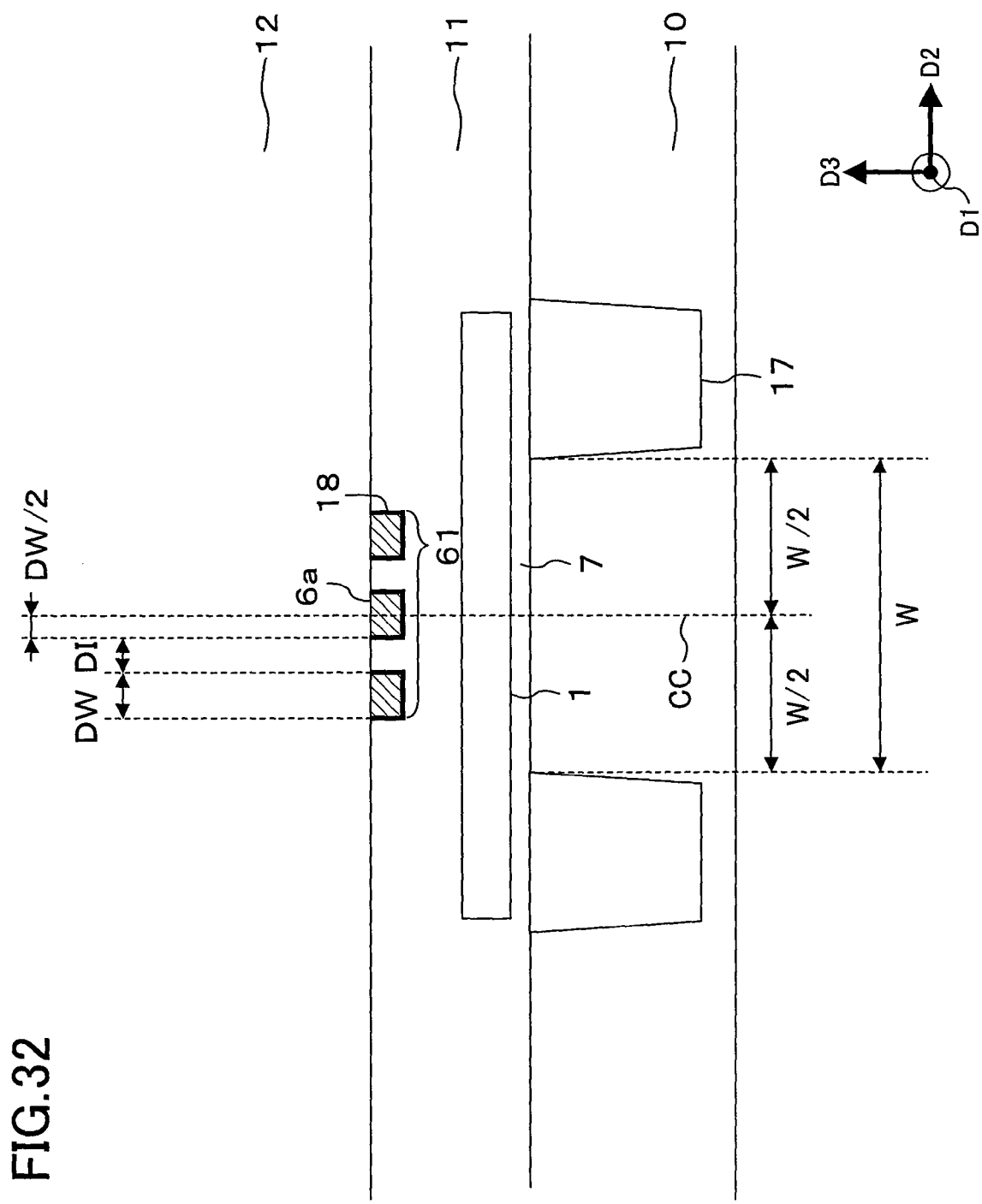
FIG. 32 is a longitudinal section taken along the line B1-B2 shown in FIG. 30.

Referring to FIGS. 30 to 32, the barrier metal is provided around each of the dummy metal segments of the dummy metal fill 61 in the MOS transistors of Embodiment 4. However, the same effect is obtained even if the barrier metal is provided around each of the dummy metal segments of the dummy metal fill in the MOS transistors of any one of Embodiments 5 to 9.

Figure 33:
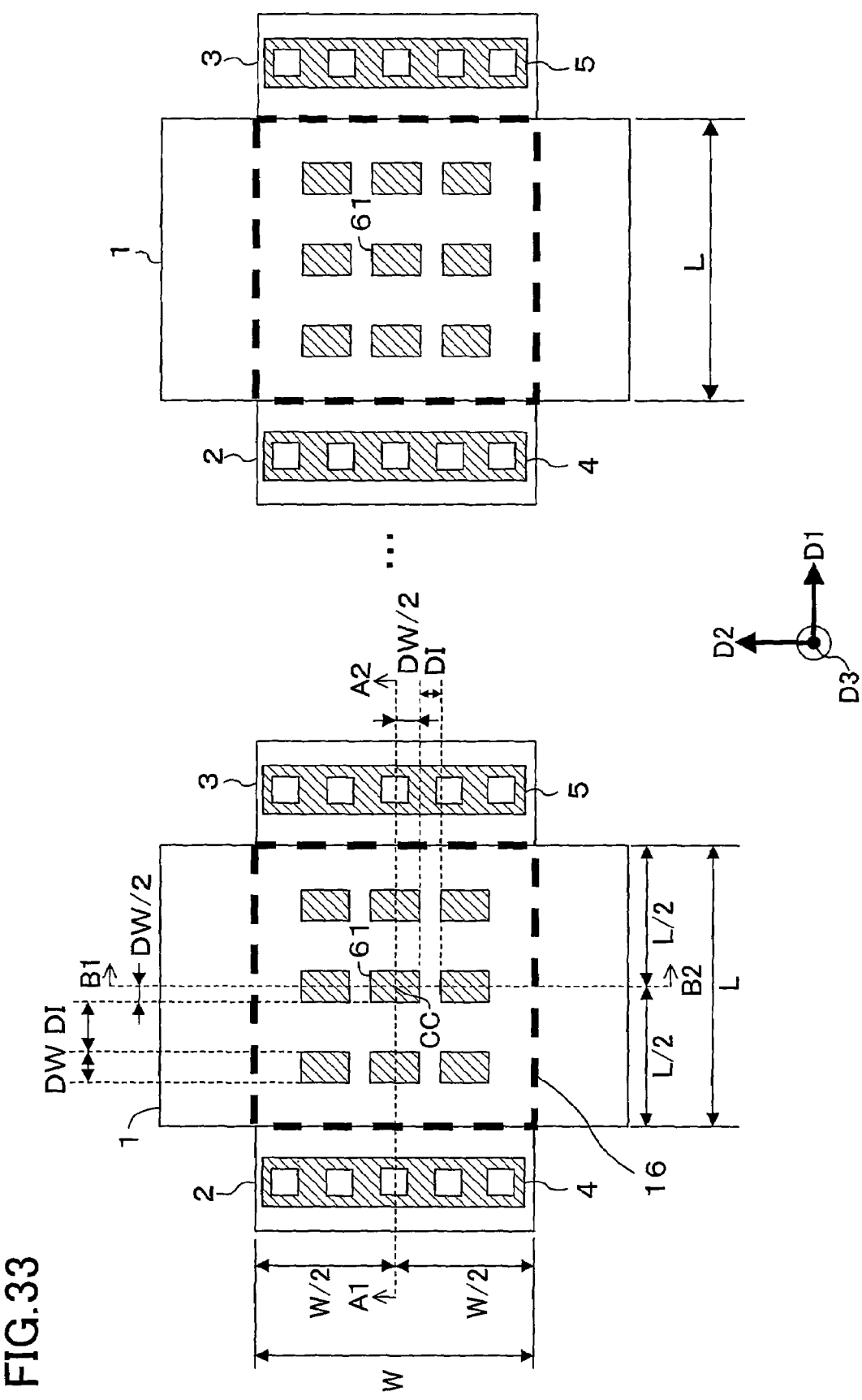
FIG. 33 is a plan view illustrating a semiconductor device in which each dummy metal segment has a rectangular shape.
Figure 34:
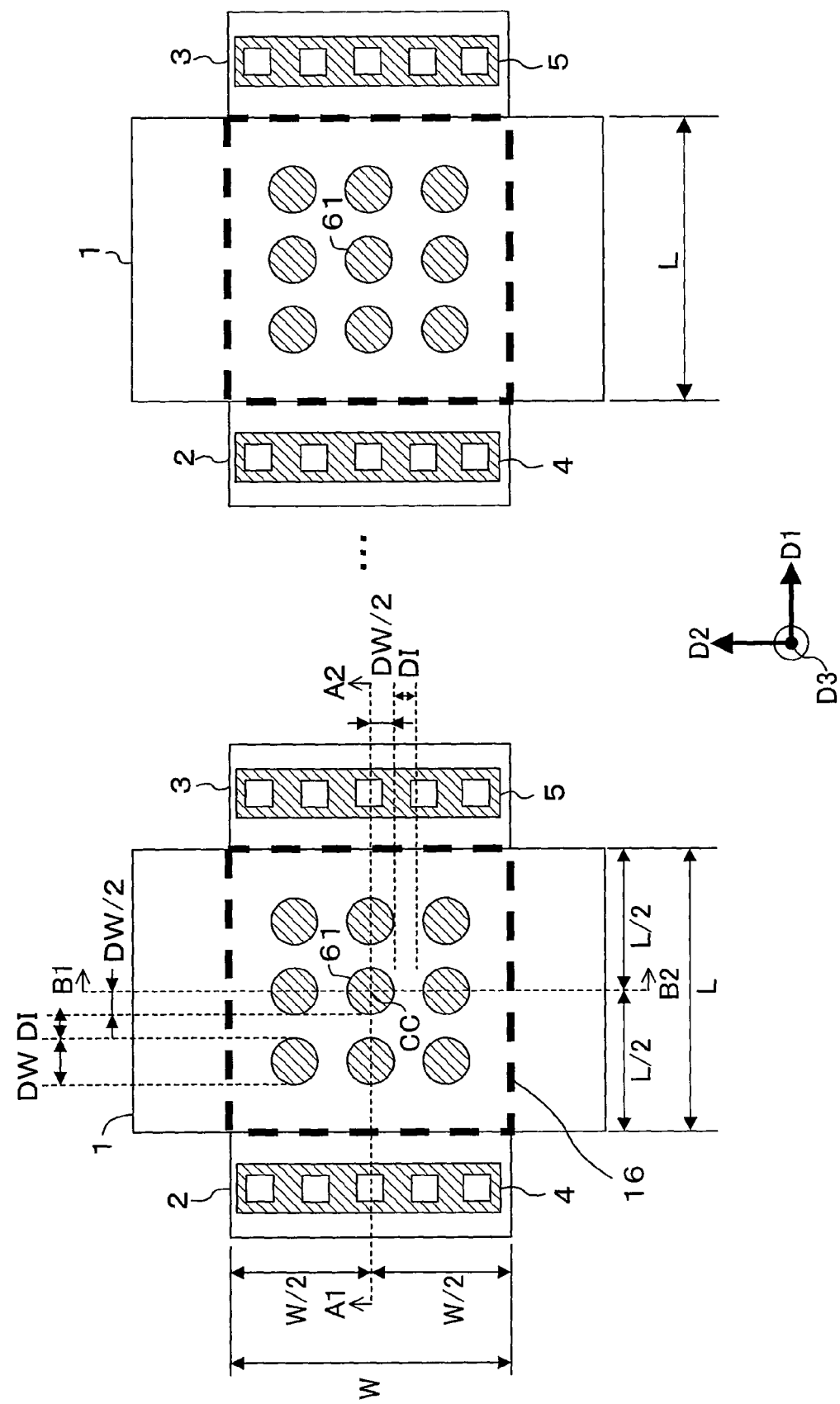
FIG. 34 is a plan view illustrating a semiconductor device in which each dummy metal segment has a round shape.
Figure 35:
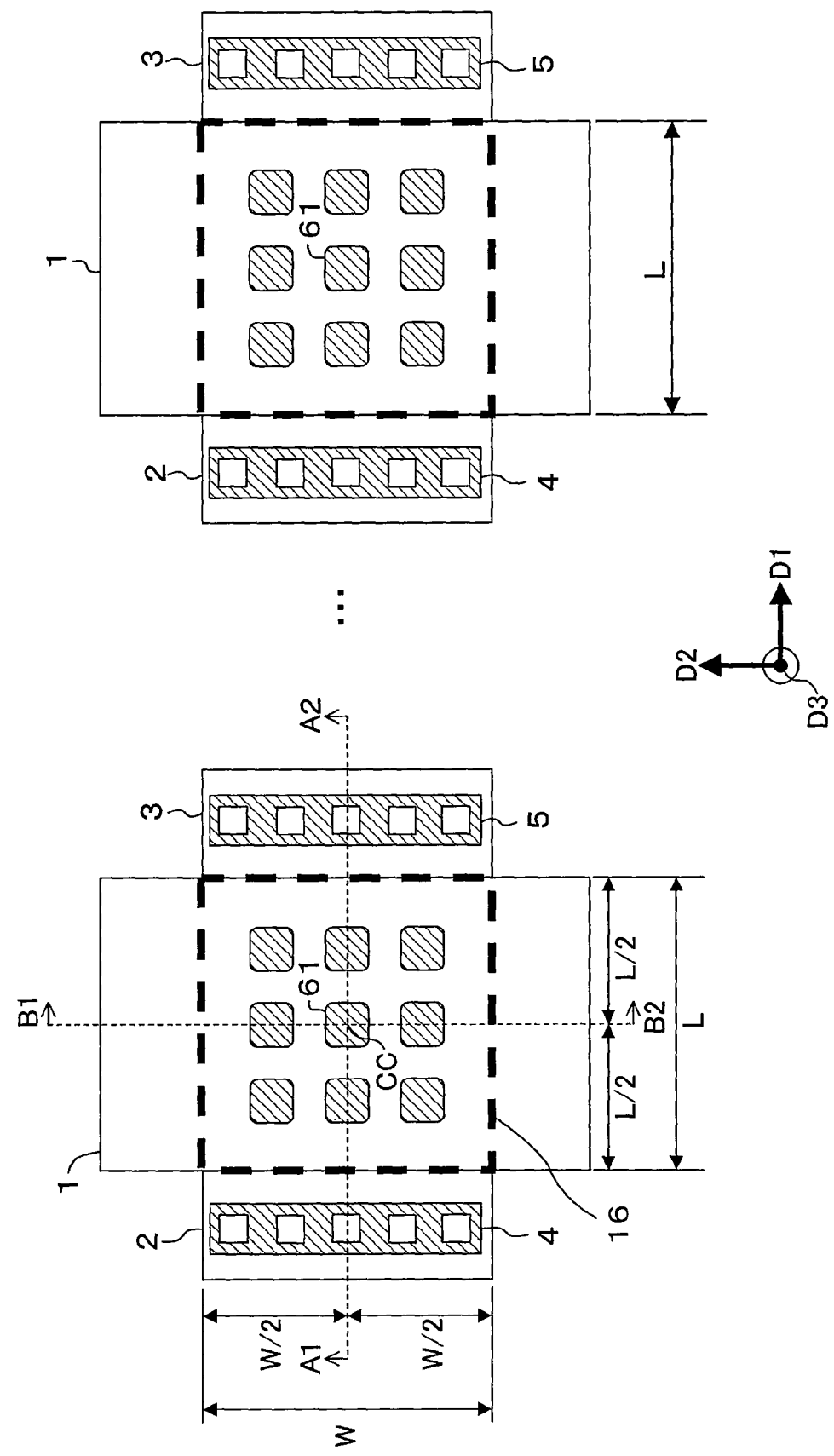
FIG. 35 is a plan view illustrating a semiconductor device in which each dummy metal segment has a square shape with rounded corners.
Figure 36:
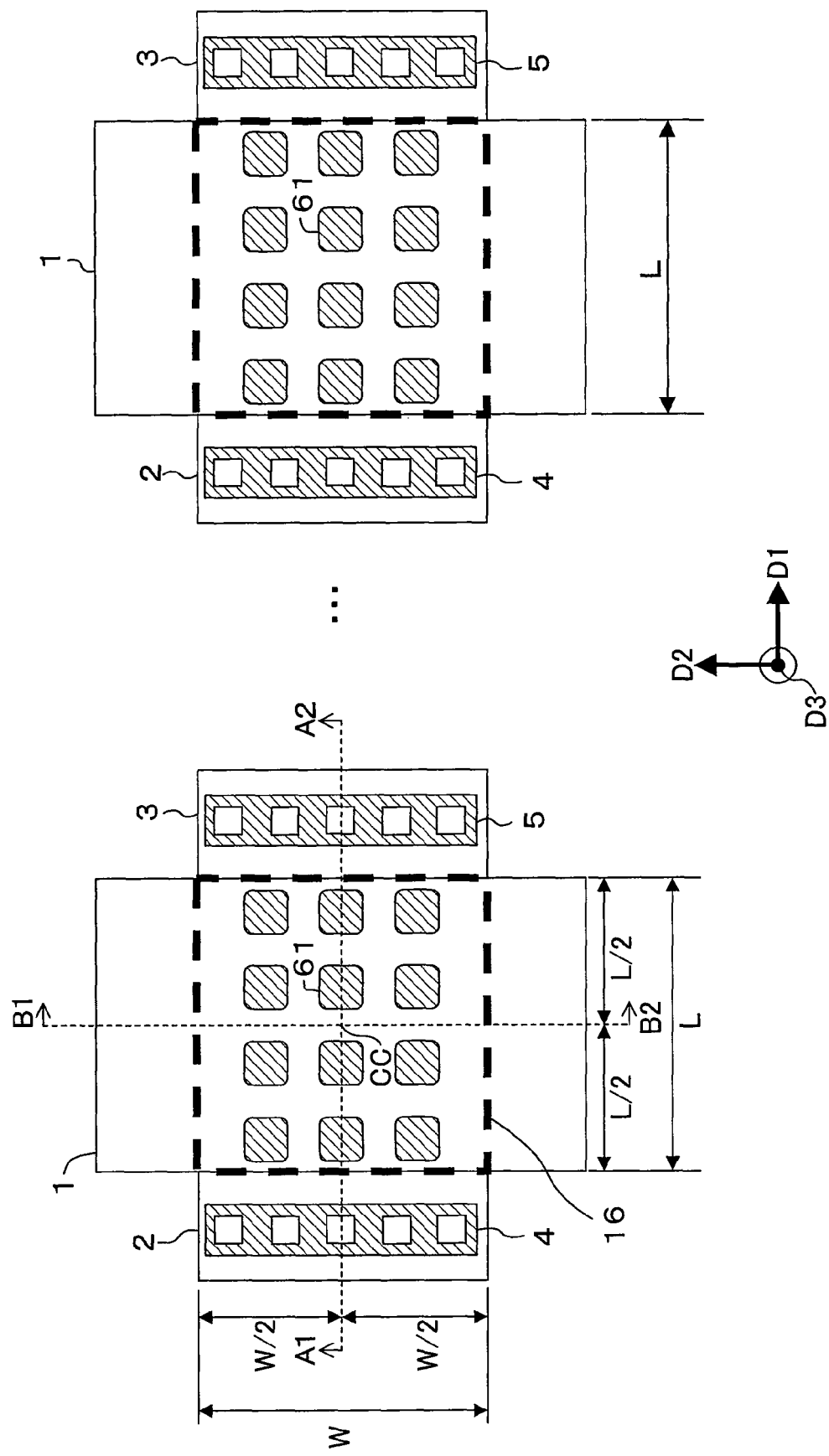
FIG. 36 is a plan view illustrating a semiconductor device in which each dummy metal segment has a square shape with rounded corners.
Figure 37:
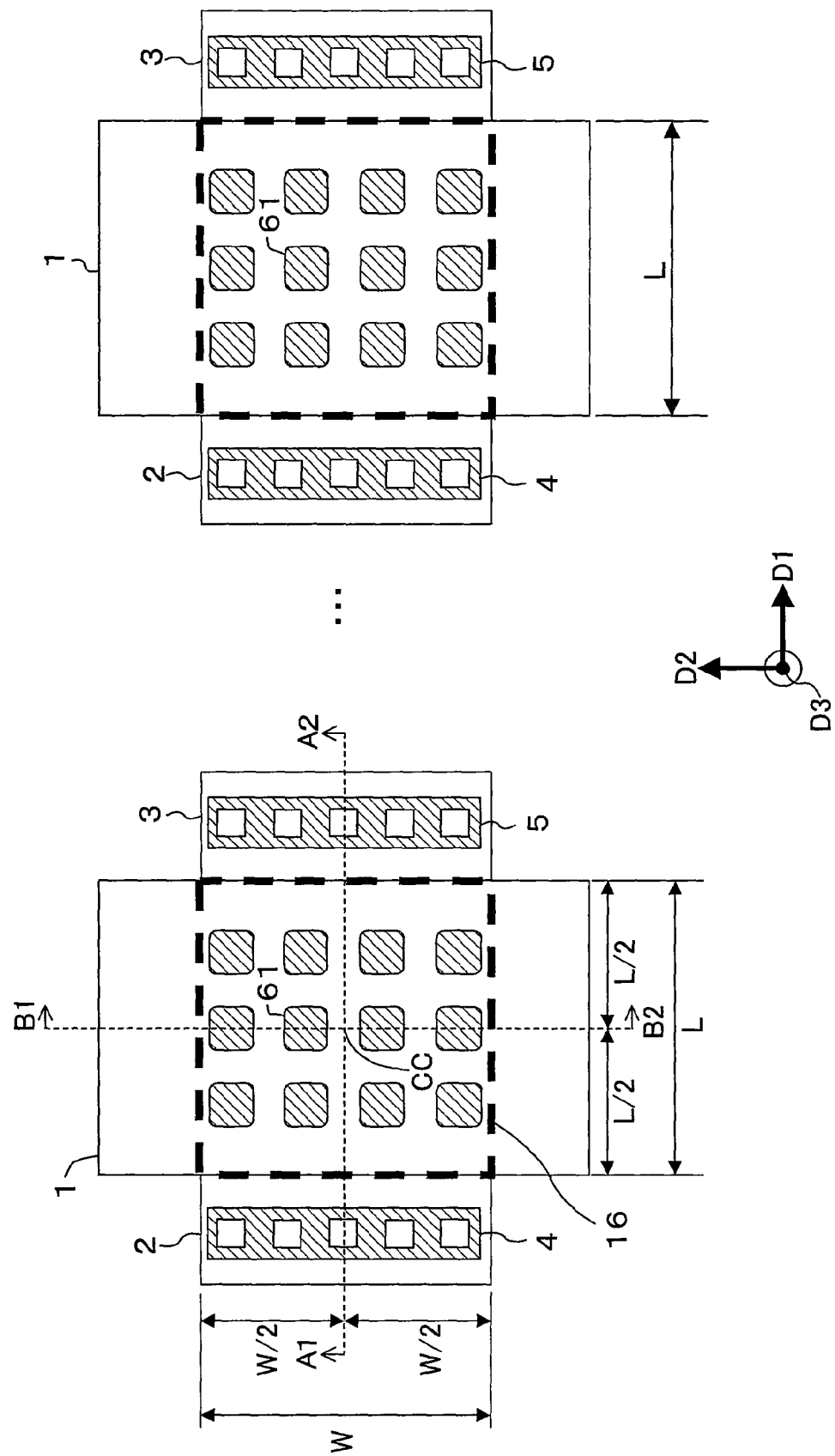
FIG. 37 is a plan view illustrating a semiconductor device in which each dummy metal segment has a square shape with rounded corners.
Figure 38:
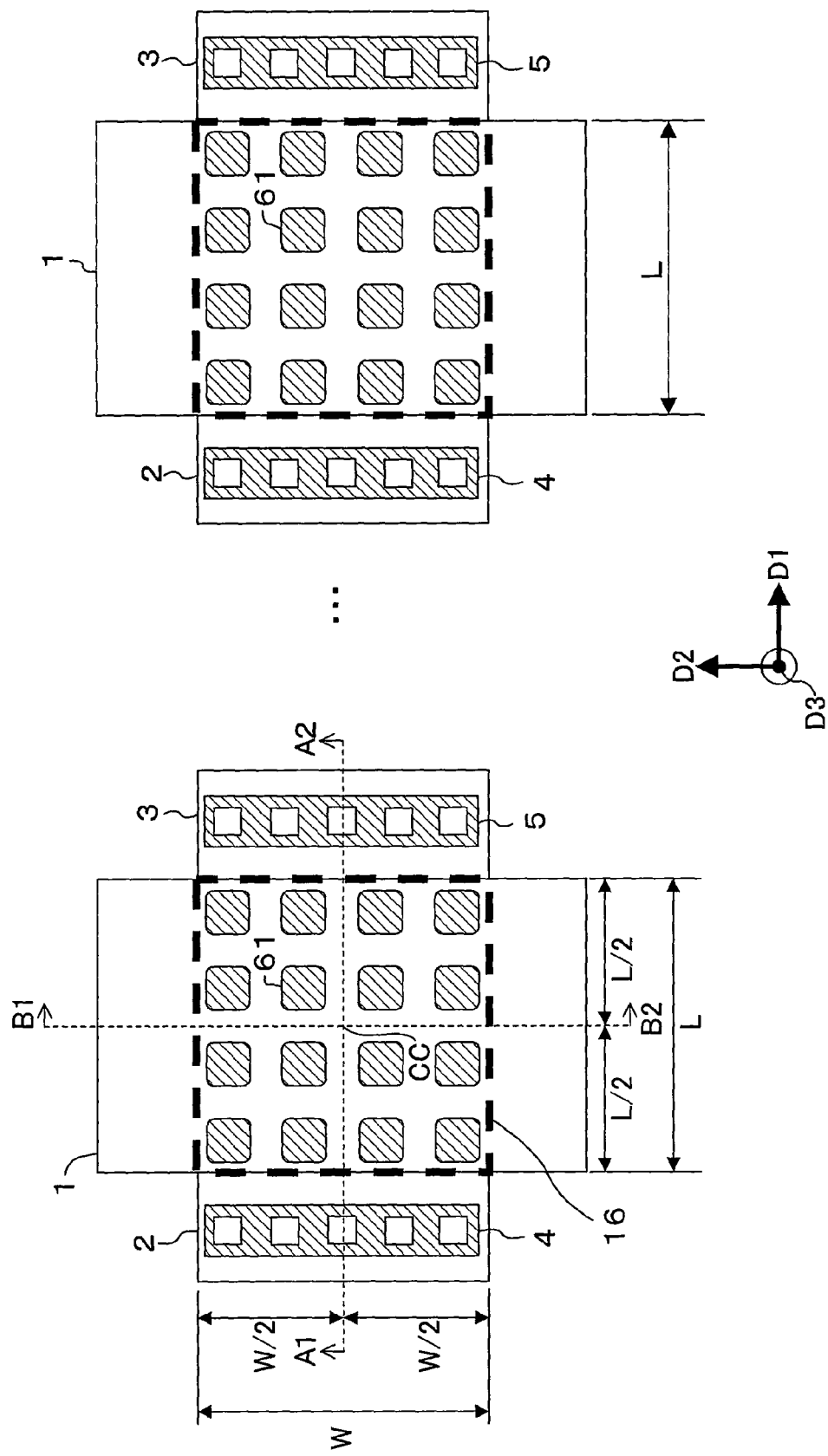
FIG. 38 is a plan view illustrating a semiconductor device in which each dummy metal segment has a square shape with rounded corners.

In Embodiments 4 to 10, each of the dummy metal segments forming the dummy metal fill has a square shape. However, the shape may be a rectangular shape as shown in FIG. 33 or a round shape as shown in FIG. 34.

Further, as shown in FIGS. 35 to 38, each of the dummy metal segments forming the dummy metal fill may have a square shape with rounded corners. In this case, the roundness of the corners depends on the marginal performance of a masking technology. The dummy metal segments having such a shape are also arranged in point symmetry with respect to the geometric center CC of the channel region 16. Thus, the same effect as that of Embodiments 4 to 10 is obtained.

Modified Embodiments

Figure 39:
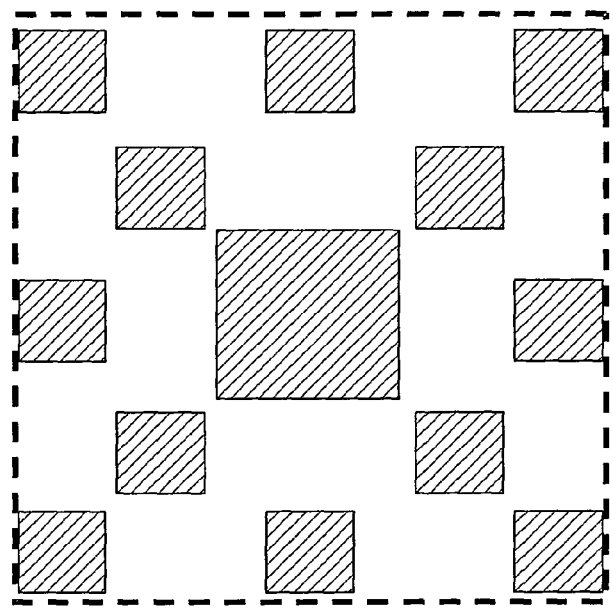
FIG. 39 is a view illustrating a layout of the dummy metal segments according to a modified embodiment of the present invention.

As shown in FIG. 39, the shape of one of the dummy metal segments in the dummy metal fill may be changed.

Figure 40:
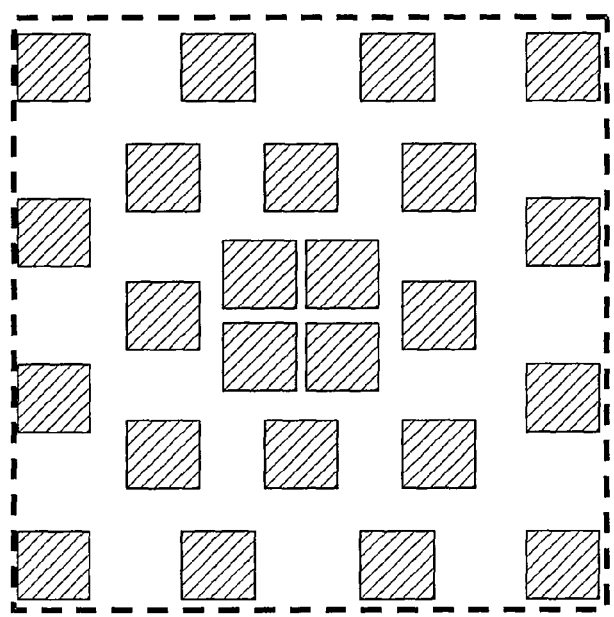
FIG. 40 is a view illustrating a layout of the dummy metal segments according to a modified embodiment of the present invention.

As shown in FIG. 40, some of the dummy metal segments in the dummy metal fill may be arranged at different intervals.

Figure 41:
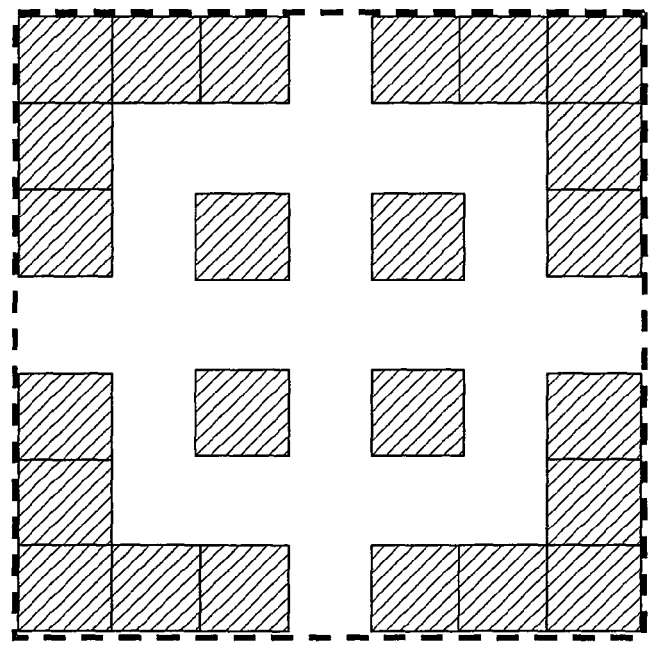
FIG. 41 is a view illustrating a layout of the dummy metal segments according to a modified embodiment of the present invention.
Figure 42:
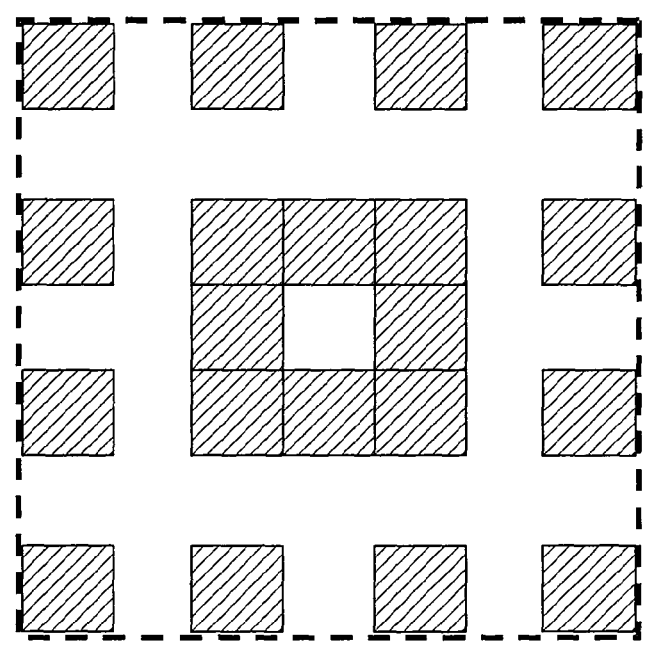
FIG. 42 is a view illustrating a layout of the dummy metal segments according to a modified embodiment of the present invention.

As shown in FIGS. 41 and 42, some of the dummy metal segments in the dummy metal fill may be bonded together.

Figure 43:
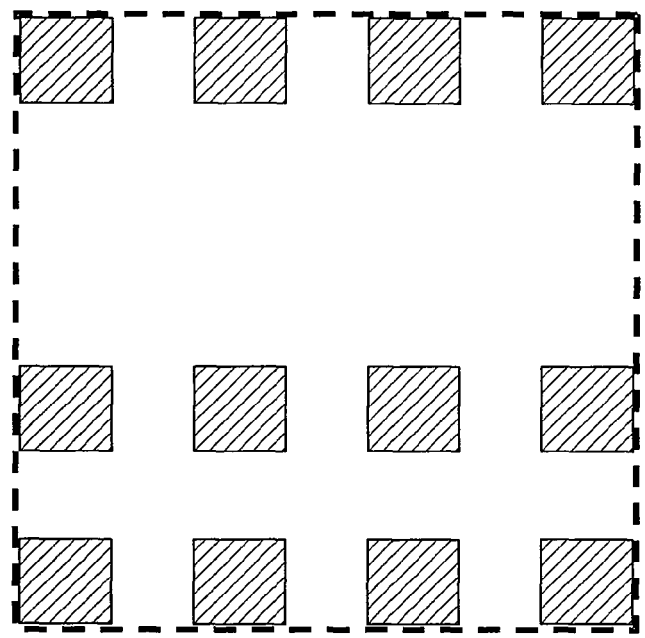
FIG. 43 is a view illustrating a layout of the dummy metal segments according to a modified embodiment of the present invention.
Figure 44:
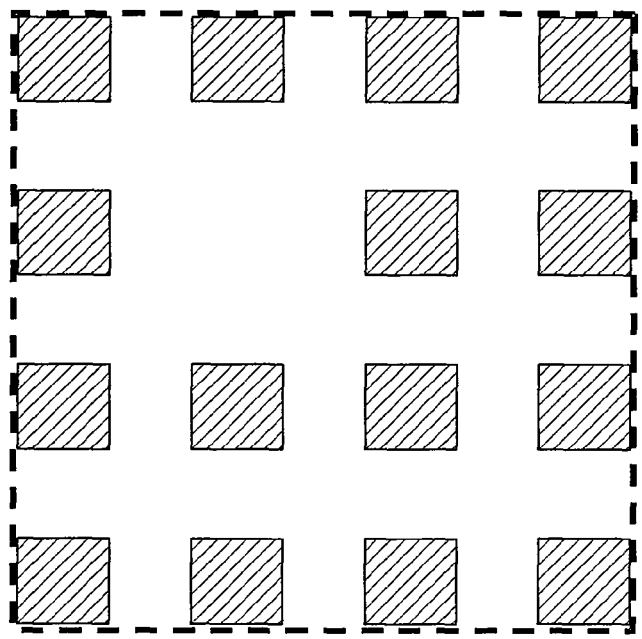
FIG. 44 is a view illustrating a layout of the dummy metal segments according to a modified embodiment of the present invention.
Figure 45:
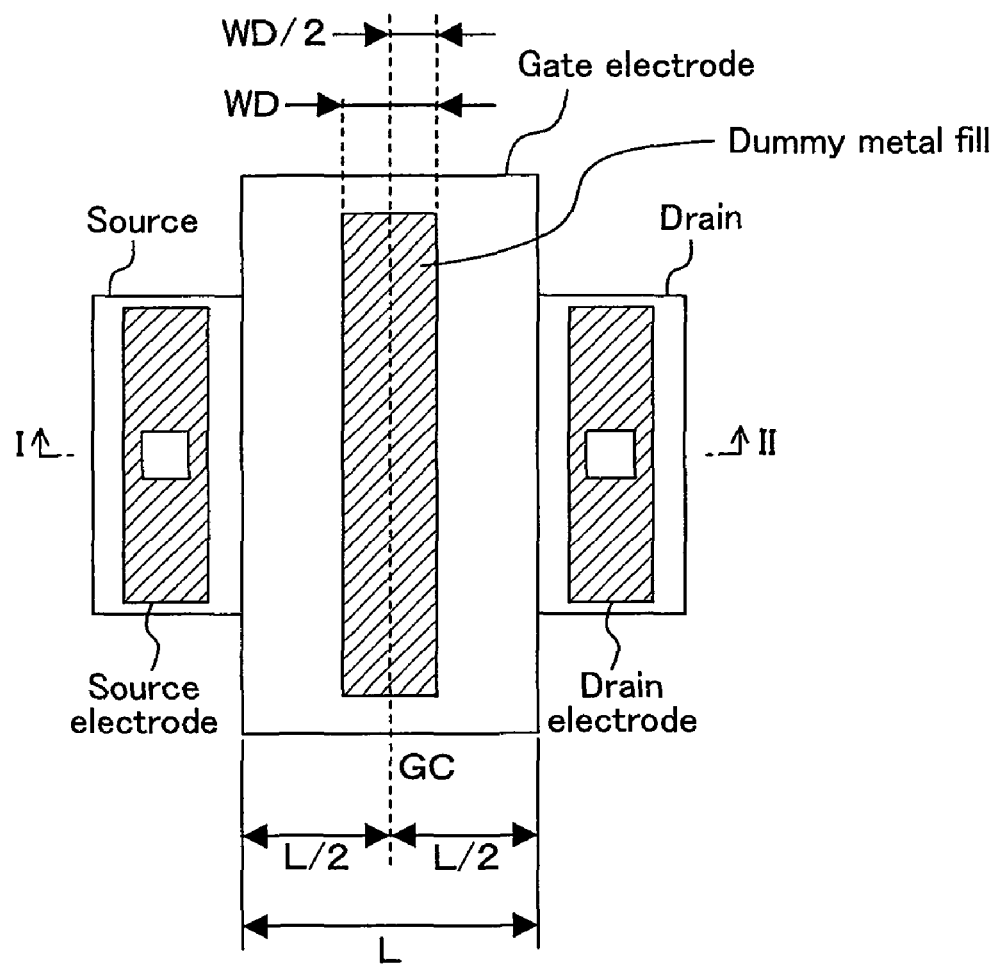
FIG. 45 is a plan view schematically illustrating a conventional semiconductor device.
Figure 46:
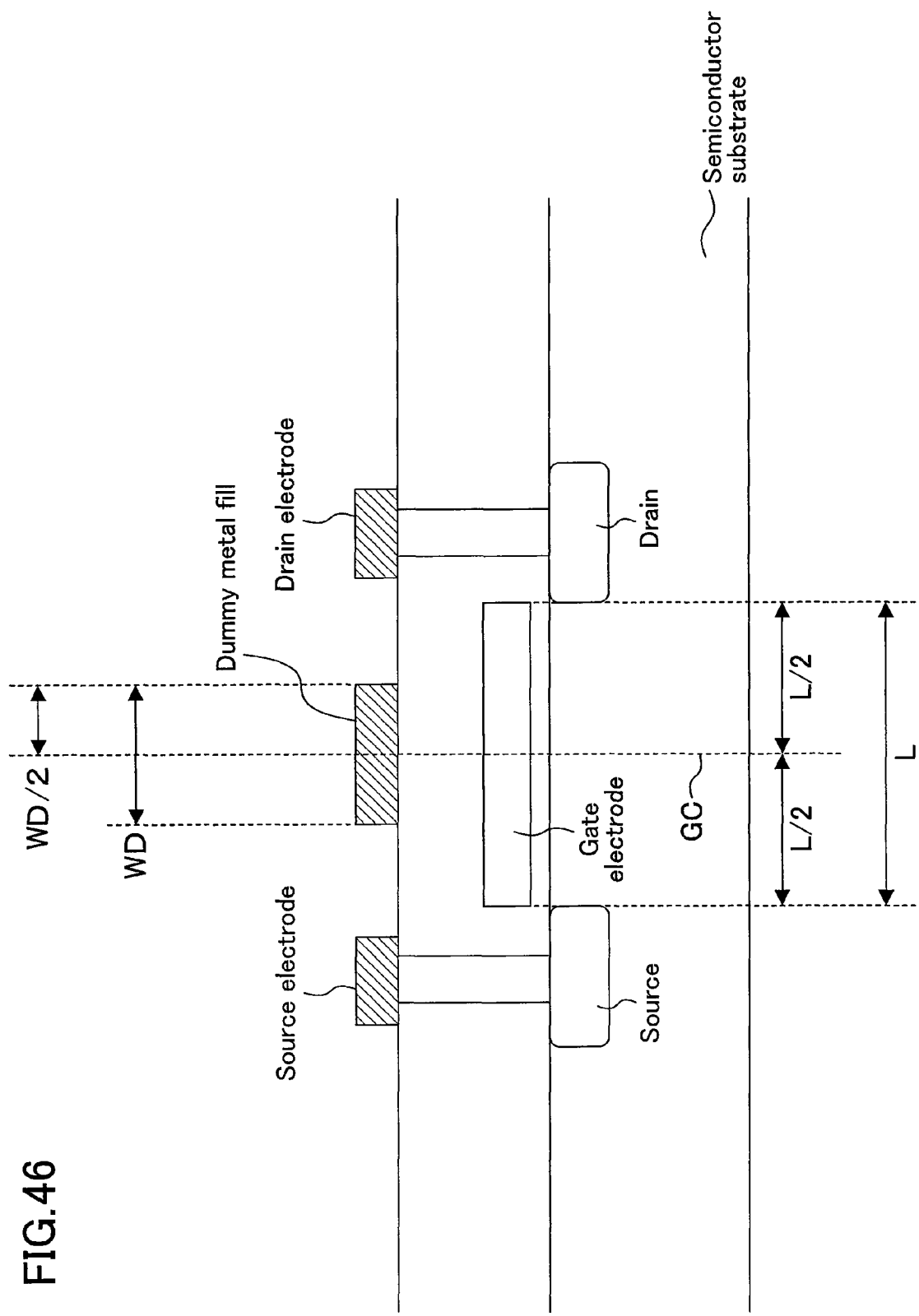
FIG. 46 is a sectional view of the semiconductor device of FIG. 45.
Figure 47:
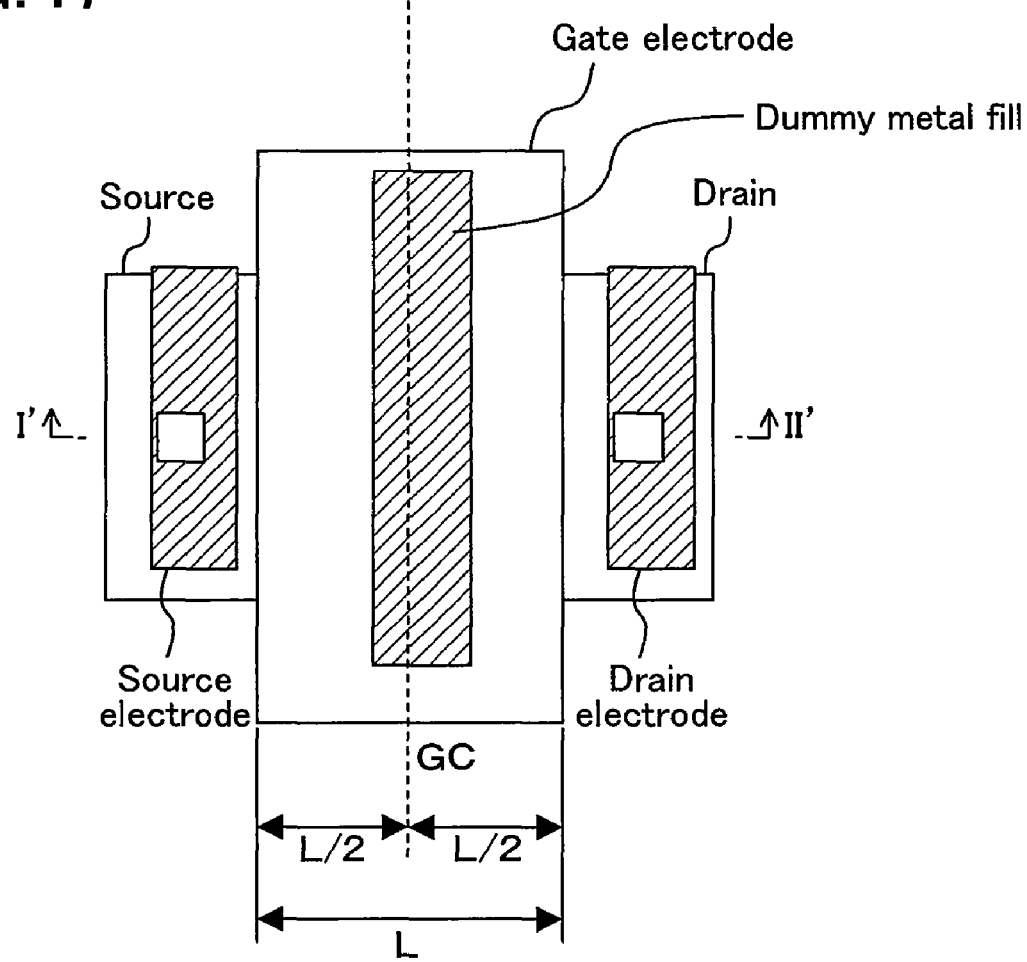
FIG. 47 is a plan view illustrating an example of the semiconductor device of FIG. 45 obtained as a result of mask alignment.
Figure 48:
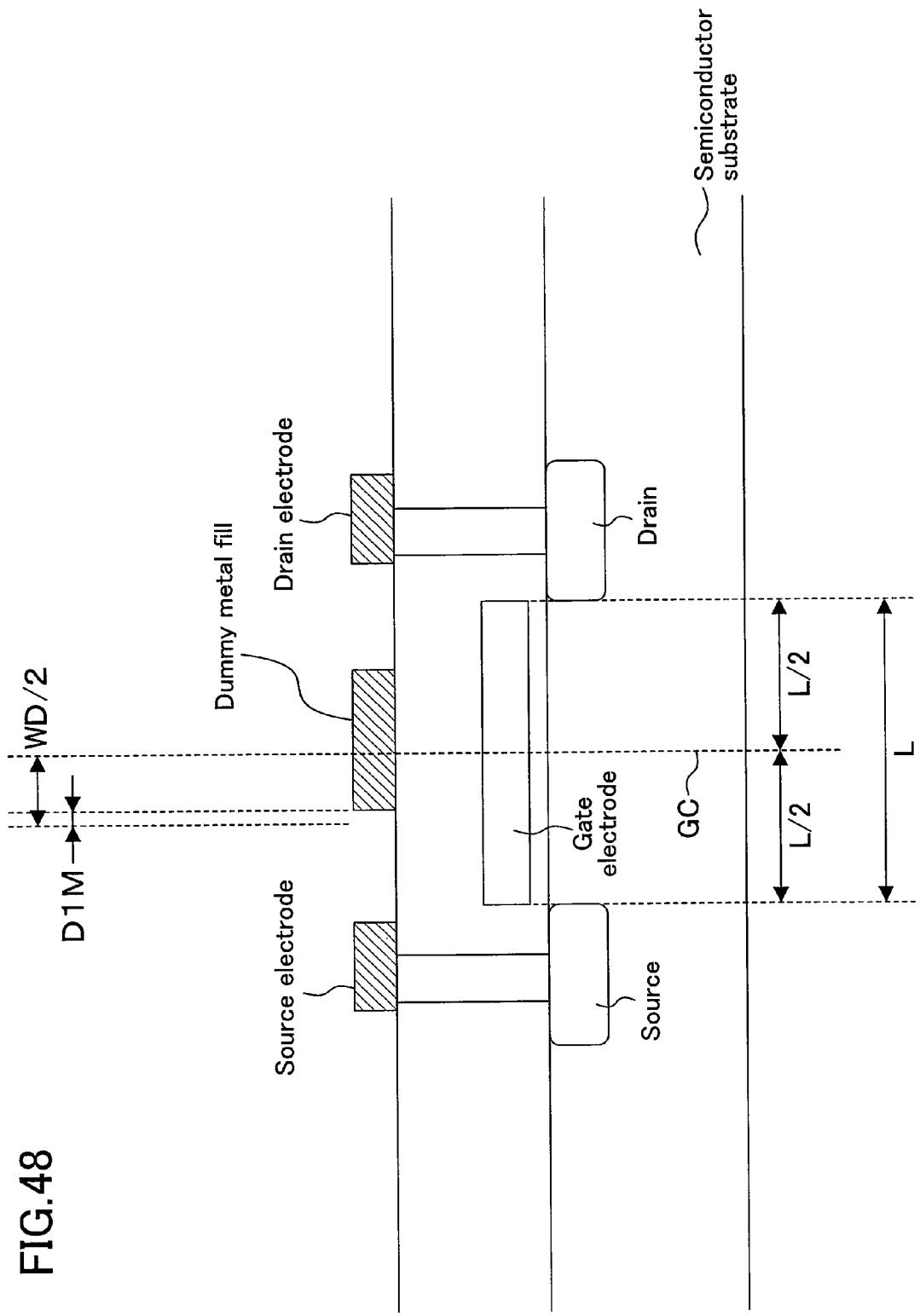
FIG. 48 is a sectional view of the semiconductor device of FIG. 47.
Figure 49:
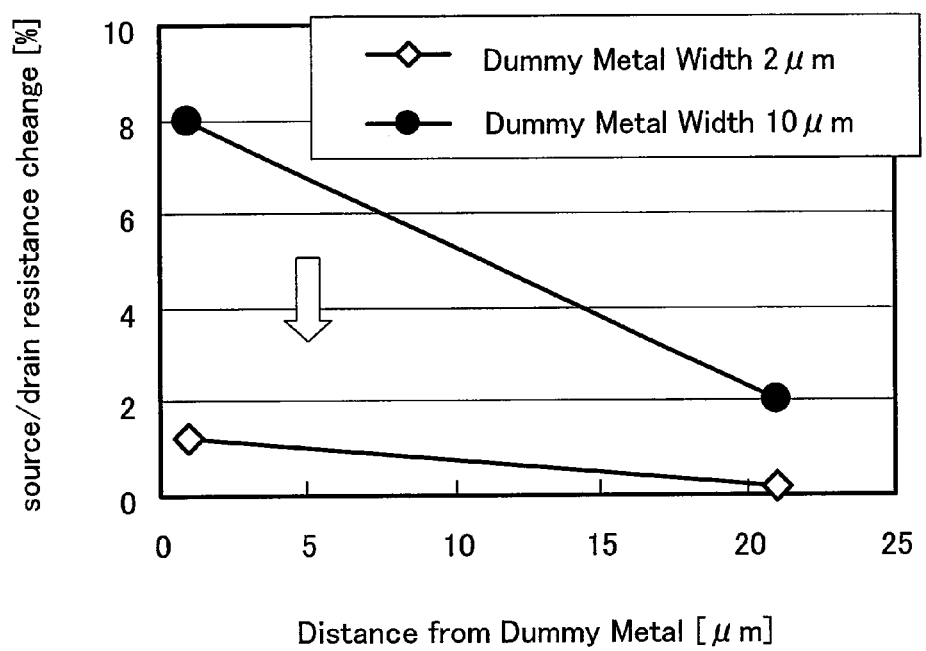
FIG. 49 is a graph illustrating relationship between rate of resistance increase of an active trace adjacent to a dummy metal fill and distance between the active trace and the dummy metal fill.

Further, as shown in FIGS. 43 and 44, some of the dummy metal segments in the dummy metal fill may be eliminated.

In any of the modified embodiments, the width of each dummy metal segment is not increased even if the channel region is enlarged, as described in Embodiments 4 to 10. Thus, dishing (excessive polish) is less likely to occur and increase of parasitic resistance of adjacent source and drain electrodes is restrained, and of course, the intended planarizing effect of the metal CMP process is ensured. Further, the degrees of characteristic degradation of the MOS transistors due to the dummy metal fill are made uniform, and at the same time, the dummy metal fill for planarizing the channel region is surely provided on the required area.

As to Embodiments 4 to 10, the dummy metal fill may be made of copper and may be buried in a groove formed in the interlayer insulating film. As compared with aluminum widely used as a wiring material, copper is lower in specific resistance and higher in current density. For these reasons, copper has been used in highly integrated device components and semiconductor products which require high current density. When use of copper and a conventional patterning process are combined, erosion of copper occurs. To avoid this phenomenon, a damascene process is applied. Specifically, copper as a wiring material is buried in a groove formed in advance in an insulating layer, and then unnecessary part of the copper is removed by the metal CMP process. Further, for electrical connection between a lower wiring layer and an upper wiring layer, a contact is formed by burying copper material. According to a so-called dual-damascene process, the contact and the upper wiring layer are formed at the same time after the lower wiring layer is formed by the damascene process.

In this case, the barrier metal used in the dual-damascene process remains on the sides and the bottom of each dummy metal segment. For example, the barrier metal 18 may be made of Ta or TaN, which are harder than the interlayer insulating film. Therefore, when the channel region 16 is enlarged, the dishing (excessive polish) is more likely to occur as compared with the case where the barrier metal is not provided. However, according to the present invention, the dishing (excessive polish) is less likely to occur and increase of parasitic resistance of adjacent source and drain electrodes is restrained, and of course, the intended planarizing effect of the metal CMP process is ensured.

In Embodiment 4 to 10, the dummy metal fill may be made of aluminum or tungsten. As long as the layout of the dummy metal fill according to the invention is adopted, the degrees of characteristic degradation of the MOS transistors due to the dummy metal fill made of aluminum, which is more likely to cause the dishing (excessive polishing) as compared with copper, are made uniform, even in the presence of the dummy metal segments required for planarizing the channel region.

As examples of the material of the dummy metal fill softer than the interlayer insulating film and the barrier metal, copper, aluminum, tungsten or other material is used. Even when the interlayer insulating film is made of a much harder material, the present invention offers the same effect. In this case, when copper, aluminum or tungsten is used as the dummy metal segments, the dummy metal segments become relatively softer than the interlayer insulating film. Therefore, the dishing (excessive polish) is more likely to occur. The dishing (excessive polish) may occur even on materials that have never been affected before. However, as long as the layout of the dummy metal fill according to the invention is adopted, the degrees of characteristic degradation of the MOS transistors due to the dummy metal fill are made uniform even in the presence of the dummy metal segments required for planarizing the channel region.

Examples of Circuits to which the Present Invention is Applicable

The MOS transistors described in Embodiments 4 to 10 are applicable to various kinds of transistors in circuits. In particular, the MOS transistors are effectively used as a differential pair in an analog circuit or transistors providing a current mirror pair.

In a circuit shown in FIG. 15, the above-described MOS transistors are used as a differential pair M1 and M2. In this case, characteristic degradation due to the dummy metal fill does not occur even when the channel region is enlarged. As a result, the transistor characteristics of the paired transistors, i.e., the differential pair M1 and M2, are made uniform, thereby reducing offset voltage.

Further, also in the circuit shown in FIG. 15, the above-described MOS transistors are used as a current mirror pair M5 and M6. In this case, characteristic degradation due to the dummy metal fill does not occur even when the channel region is enlarged. As a result, the transistor characteristics of the paired transistors, i.e., the current mirror pair M5 and M6, are made uniform, thereby reducing offset voltage.

The dummy metal fill of the present invention is configured in consideration of mask misalignment. The dummy metal fill is useful for making the characteristics of elements of a semiconductor device and applicable to analog basic circuits such as an input stage of a differential amplifier circuit and a current mirror circuit, and to analog MOS integrated circuit including the analog basic circuit.

The dummy metal fill of the present invention consisting of a plurality of dummy metal segments is useful for making the characteristics of the MOS transistors uniform. The dummy metal fill of the invention is suitably applied to various analog circuits including a transistor differential pair in a differential amplification stage and a transistor pair providing a current mirror.

What is claimed is:

1. A semiconductor device comprising:

a semiconductor substrate;

a MOS transistor formed on the semiconductor substrate including first and second main electrode regions as a source and a drain and a gate electrode for controlling a current flowing between the source and the drain; and a dummy metal fill inserted in a wiring layer formed above the MOS transistor so that the dummy metal fill is located above the gate electrode, wherein the dummy metal fill extends in a gate length direction with both ends thereof protruding from a region corresponding to the gate electrode, and wherein a plurality of the dummy metal fills are arranged in a gate width direction in a stripe pattern.

2. The semiconductor device of claim 1, further comprising first and second metal electrodes included in the wiring layer and electrically connected to the first and second main electrode regions, respectively, wherein the dummy metal fill is spaced from the first and second metal electrodes and overlaps with at least one of the first and second metal electrodes in the gate length direction.

3. The semiconductor device of claim 1, wherein the dummy metal fill is formed on a top surface of an interlayer insulating film covering the MOS transistor.

4. The semiconductor device of claim 1, wherein the dummy metal fill is buried in a groove formed in a top surface of an interlayer insulating film covering the MOS transistor.

5. The semiconductor device of claim 1, wherein the MOS transistor is a transistor used to provide a differential pair or a current mirror pair in an analog circuit.

* * * * *